(12) United States Patent
Belliveau

(10) Patent No.: US 6,357,893 B1
(45) Date of Patent: Mar. 19, 2002

(54) LIGHTING DEVICES USING A PLURALITY OF LIGHT SOURCES

(76) Inventor: Richard S. Belliveau, 10643 Floral Park, Austin, TX (US) 78759

( * ) Notice: Subject to any disclaimer, the term of this patent is extended or adjusted under 35 U.S.C. 154(b) by 0 days.

(21) Appl. No.: 09/526,499

(22) Filed: Mar. 15, 2000

(51) Int. Cl.[7] .............................................. F21V 33/00

(52) U.S. Cl. ....................... 362/285; 362/184; 362/188; 362/800

(58) Field of Search ................................ 362/184, 187, 362/188, 202, 232, 238, 240, 250, 285, 286, 288, 800, 203, 198

(56) References Cited

U.S. PATENT DOCUMENTS

| | | | |
|---|---|---|---|
| 3,670,260 A | 6/1972 | Koester et al. ............. | 331/94.5 |
| 4,636,923 A | 1/1987 | Oyama et al. ................ | 362/80 |
| 4,712,167 A | 12/1987 | Gordin et al. .............. | 362/233 |
| 4,729,070 A | 3/1988 | Chiu ........................... | 362/33 |
| 4,745,526 A | * 5/1988 | Sestak ........................ | 362/250 |
| 4,775,967 A | 10/1988 | Shimada et al. ............. | 369/45 |
| 4,834,492 A | 5/1989 | Ishii et al. .................. | 350/96.2 |
| 4,855,884 A | 8/1989 | Richardson ................. | 362/278 |
| 4,987,523 A | 1/1991 | Lindabury et al. .......... | 362/188 |
| 5,161,046 A | 11/1992 | Oshima et al. .............. | 359/212 |
| 5,523,591 A | 6/1996 | Fleming et al. ............. | 257/91 |
| 5,594,254 A | 1/1997 | Palmer ....................... | 250/504 |
| 5,752,766 A | 5/1998 | Bailey et al. ................ | 362/250 |
| 6,016,038 A | 1/2000 | Mueller ...................... | 315/291 |
| 6,109,766 A | * 8/2000 | Baliozian ................... | 362/285 |

OTHER PUBLICATIONS

Edmond Scientific, "1996–1997 Optics & Optical Instruments Catalog", p. 248.

Nichia Chemical Industries, Ltd., "Nichia High Power White LED", Japan.

Nichia Corporation, "Specifications for Nuchia UV LED", Aug. 28, 1999, pp. 1–5, Japan.

Wildfire, "250 Watt Ultraviolet Lighting Fixtures", pp. 1–2, Internet.

Wildfire, "Ultraviolet Fluorescent Lighting Fixtures", pp. 1–2, Internet.

Schott Desag, "Mug–2 UV Black Filters", pp. 1–2, Germany.

Artistic Licence (UK) Ltd., "Colour–Fill CF250 & CF250M", pp. 3–29, England.

High End Systems, Inc., "The High End Systems Product Line", 1997, Entire Brochure, Austin, Texas.

* cited by examiner

Primary Examiner—Y. My Quach-Lee
(74) Attorney, Agent, or Firm—Walter J. Tencza, Jr.

(57) ABSTRACT

A device is disclosed that uses a plurality of light sources. The light sources may be light emitting diodes (LEDs). The light sources are arranged and mounted to a deformable flexible substrate. The light sources are arranged and mounted to the substrate as to emit their radiation perpendicular to the substrate. The substrate is flexed in a concave or convex manner by motor, magnetic field or other mechanical means. The light sources may emit their radiation perpendicular to the substrate, or the may diverge or converge their radiation away from the substrate. Perforations in the substrate provide cooling to the light sources by convection or forced air. A threaded holder may be screwed onto threads on a case in order to bend the flexible substrate to change the direction of light from the light sources mounted to the flexible substrate.

12 Claims, 18 Drawing Sheets

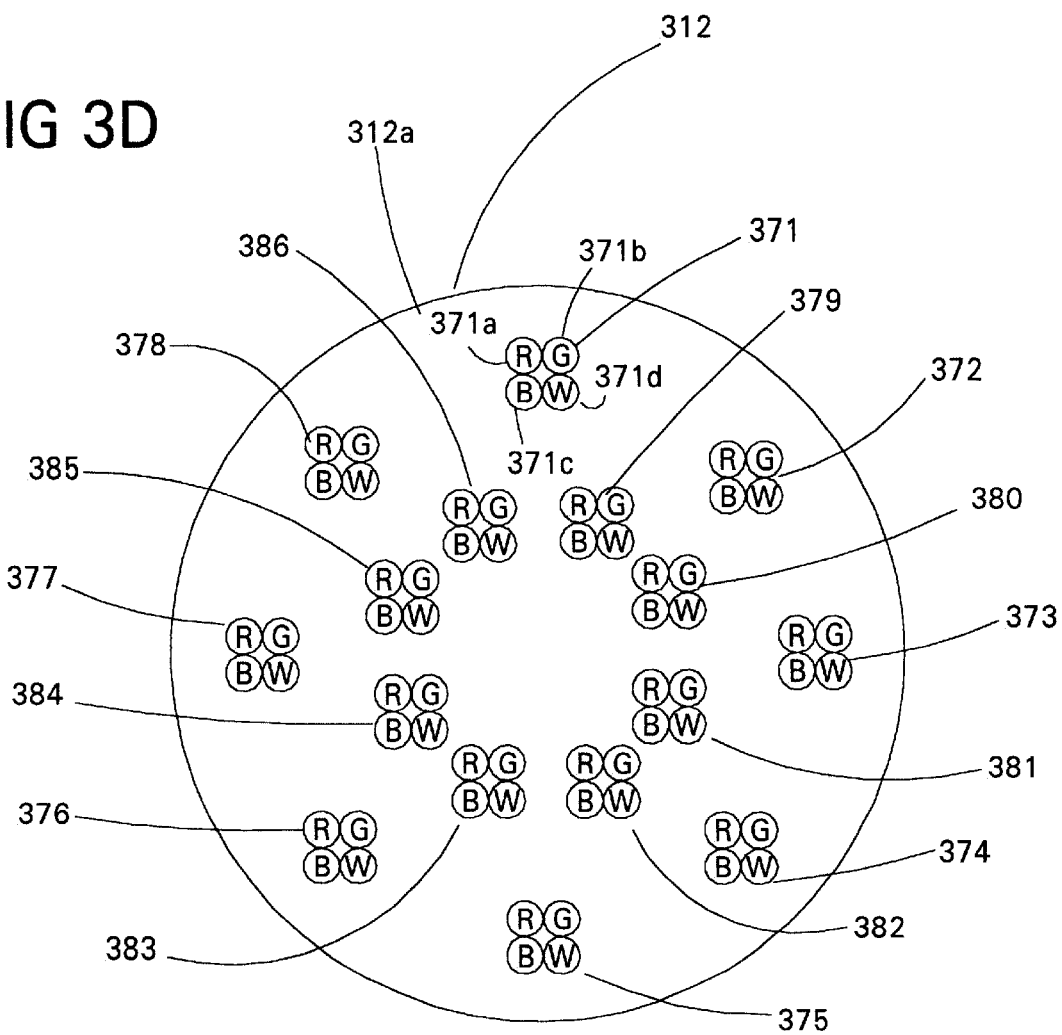

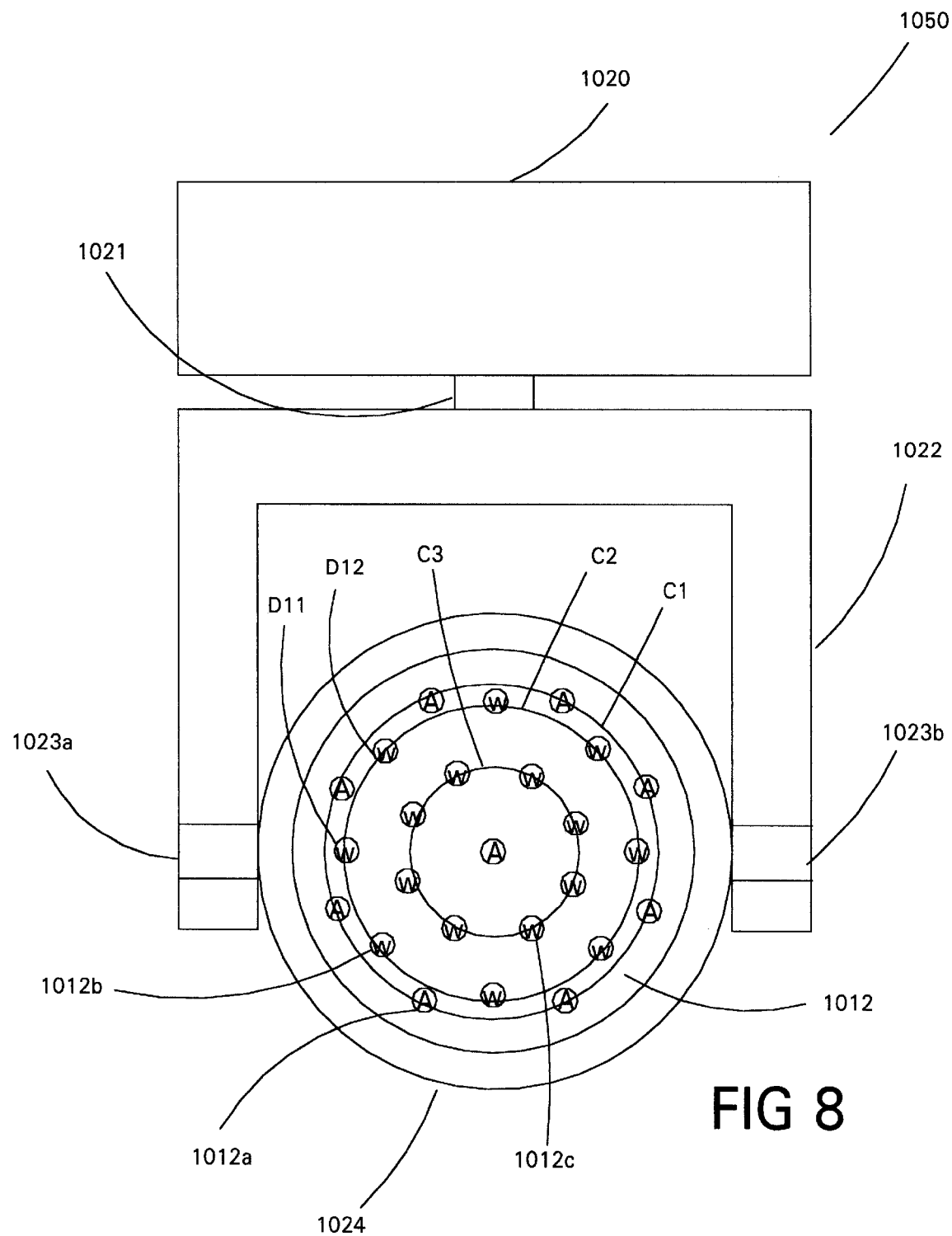

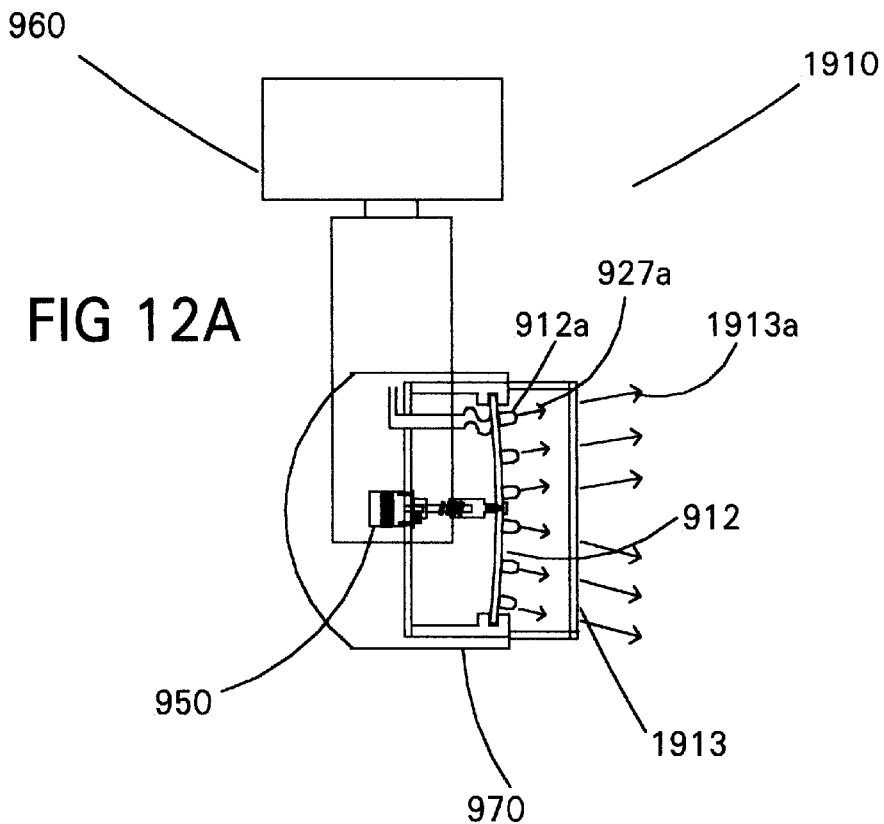
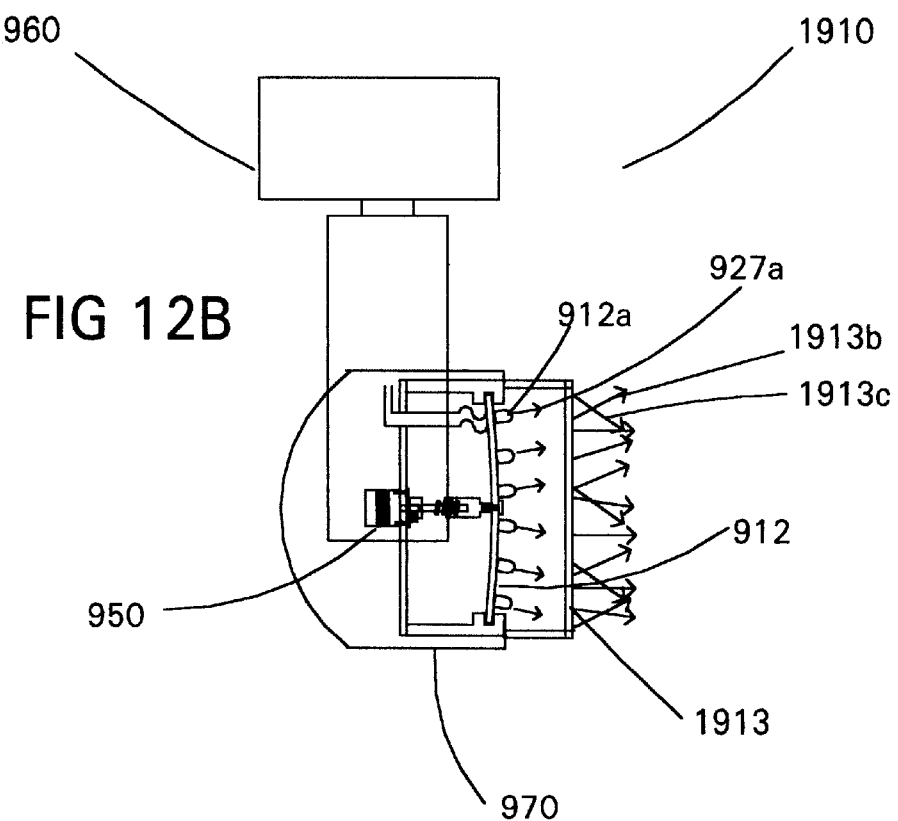

LIGHTING DEVICES USING A PLURALITY OF LIGHT SOURCES

FIELD OF THE INVENTION

This invention relates to improved methods and apparatus for using a plurality of light sources to illuminate an area or aperture. The invention discloses improvements to devices using a plurality of light sources where the plurality of light sources are multiple wavelengths and may be light emitting diodes (also called in this application "LEDs"). The inventions contained within the text are directed at hand held flashlights, theatrical lighting, and may have other applications. Theatrical lighting is used in concerts, special events, nightclubs, television studios, restaurants and theme parks.

BACKGROUND OF THE INVENTION

When using a lighting device to illuminate an area it is often found necessary to change the profile of the projected light to match the object to be illuminated. When using a conventional hand held flashlight for example often the flashlight is equipped with a means for changing the profile of the emitted light from a spot to a wash. When using a conventional reflector and a single light source the reflector is often moved in relative position to the source to accomplish changing the profile. U.S. Pat. No. 4,987,523 to Lindabury discloses an illumination device that moves the lamp in relative position to the reflector.

U.S. Pat. No. 4,855,884 to Richardson discloses a variable beamwidth stage light with a single light source, relying on an axially movable reflector for changes in beamwidth. The reflector is constructed of a plurality of reflective leaves that are moved by a motor to change the focal length of the reflector. When working with a plurality of light sources, various methods have been disclosed that enable the multiple light sources to be converged or diverged. U.S. Pat. No. 4,729,070 to Chiu discloses an adjustable ring for concentrating multiple beams of light. Chiu discloses an apparatus for changing the angle of incidence of a plurality of light sources arranged in a ring. A threaded holder surrounds the ring of light sources while a cam mechanism adjusts the angle of the light sources that is operated by turning the threaded holder. U.S. Pat. No. 5,752,766 to Bailey et al. discloses a multi-color focusable LED stage light. A linear actuator is operable to move a base member containing an array of LEDs which in turn cause the LED array to change the direction of the optical axes of a substantial number of LEDs. By deforming the base member 20 in Bailey, the LEDs can be converged or diverged on an area to be illuminated.

The Bailey patent does not discuss the issues of thermal management. High intensity light emitting diodes (LEDs) have a critical upper temperature operating limit. This can easily be exceeded when the LEDs are arranged in-groups as in the Bailey patent and the ambient air temperature rises.

Multiparameter lights of the prior art utilize a single light source with motors to vary the focus, color, position and intensity. U.S. Pat. No. 3,845,351 to Ballmoos et al. titled: METHOD AND APPARATUS FOR THE ADJUSTMENT OF A PLURALITY OF FLOODLIGHTS discloses a number of floodlights especially for the illumination of a stage or studio, in which the parameters azimuth, elevation, brightness, focus and color of a bundle of light rays of each floodlight are adjusted to an optimum value for any one of a plurality of lighting effects.

U.S. Pat. No. 4,392,187 to Bornhorst titled: Computer controlled lighting system having automatically variable position, color, intensity and beam divergence illustrates another example of the prior art. Each of the instruments houses a central lamp and an optical system designed to collimate the light from the lamp and vary the parameters of the light by inserting motor driven optical components into the light by remote control.

Multiparameter lights are generally controlled by a central control system via a serial data communications system. An operator operating the central control system may control each multiparameter light separately to adjust the parameters. Each multiparameter light may be provided with a communications address so that each multiparameter light may be addressed separately by an operator operating the control system Multiparameter lights of the prior art are depicted in the High End Systems Product Line 1997 brochure.

SUMMARY OF THE INVENTION

The present invention in one embodiment provides an inexpensive method of converging and diverging a plurality of light sources by mounting the light sources to a flexible substrate that may be deformed to change the angular relationship of the plurality of light sources. Mechanical systems for deforming the base member or substrate are disclosed.

In the preferred embodiment of the invention, the flexible substrate is laminated with a conductive material to supply electrical current to a plurality of light emitting diodes. The light emitting diodes are arranged symmetrically around the substrate to provide uniform illumination. A battery cell supplying electrical current is engaged with the flexible substrate as to provide electrical contact and to provide a variable force on the substrate. The variable force on the flexible substrate flexes the substrate and in turn changes the direction of the concentration or rays of light from the light sources, (which may be light emitting diodes), changing the angle of incidence of the light emitted by the light sources. A threaded member may be used to adjust the force on the flexible substrate applied by the battery cell.

In another embodiment of the present invention an electromagnetic force is applied to the flexible substrate and used to deform the substrate. In yet another embodiment of the invention a motor and lead screw is used to selectively deform the substrate. In another embodiment, a cam is used.

In another embodiment of the present invention a light is constructed with multiple light sources that include multiple wavelengths. The light sources' intensity or enabling may be individually controlled by wavelength groups or each individual LED may be controlled. Furthermore subgroups of the same wavelength or subgroups of multiple wavelengths may be individually enabled or there intensity controlled. The plurality of light sources may consist of light sources that emit wavelengths for red, green and blue light. The light utilizing the multiple light sources may use the red, green and blue wavelengths in a system of additive color mixing. U.S. Pat. No. 5,752,766 to Bailey et al., is incorporated by reference herein and specifies a system of additive color mixing. The multiple light sources may also contain additional wavelength LEDs such as amber or yellow LEDs. Also broad-spectrum visible white light emitting diodes such as those manufactured by Nichia Chemical Corporation of Japan may be included. A broad spectrum white light source may be added to the plurality of light sources to aid in the overall output of white light or to be mixed into variations of the colored light sources to produce further variations of pastel colors that would not be achievable by using a conventional additive Red, Green and Blue color mixing system.

The term "white light LED" refers to a light emitting diode that provides a spectrum that is seen by the human eye for all purposes as white.

In yet another embodiment a substrate is mounted with a plurality of light sources. One of the important design restraints found while designing lighting instruments is the removal of heat generated by the light source. High intensity light emitting diodes (LEDs) have a critical upper temperature operating limit. This can easily be exceeded when the LEDs are arranged in-groups and the ambient air temperature rises. In one embodiment of the present invention this problem is solved by the use of ventilation holes placed through the flexible substrate. Ventilation holes are strategically placed in the substrate as to provide airflow either by a forced air system or by convection and to assist in dissipation of unwanted heat that is generated by the light sources and increase the life of the light sources.

In yet another embodiment a multiparameter light is disclosed that utilizes a plurality of remote controlled light sources in addition to remote controlled motors to vary the focus, color, position and intensity of the light emitted by the multiparameter light. Several multiparameter lights each utilizing a plurality of light sources may be remotely controlled by an operator or computer control system.

An improvement over U.S. Pat. No. 5,752,766 includes an additional colored LED such as yellow or amber. Artistic License a United Kingdom company has offered a lighting instrument called the "Colour-Fill" that includes amber LEDs along with the Red, Green and Blue LEDs. This information can be found at "www.artisticlicence.com."

One improvement to the use of an additional colored LED such as amber or yellow is the use of a continuous spectrum white LED. Although the use of an amber or yellow LED along with the red, blue and green helps provide a wider range of color variation especially in the pastel ranges (or less saturated colors) it does not provide energy in the blue-green range. The addition of one or more white light LEDs help to provide a greater range of pastel colors including those in the blue-green wavelengths.

A light source constructed of a plurality of LEDs may also be constructed primarily of white continuous spectrum LEDs as shown in one embodiment of the present invention. White LEDs like that manufactured by Nichia are constructed of a phosphor that is radiated by short wavelengths similar to the standard fluorescent lamp. The advantage to a light source constructed of a plurality of white continuous spectrum LEDs is that the white light created by the LEDs contains energy throughout the visible spectrum. When creating white light through the use of an additive color system using red, green and blue wavelengths (RGB), the spectral energy adjacent to the red, green and blue wavelengths is usually omitted. An RBG system used to create white light can sometimes be problematic when illuminating objects that absorb or reflect very specific wavelengths of light. Illuminating these type of objects with RGB derived white light often may result in an erroneous perception of color by the viewer as compared to viewing the object under continuous spectrum white light.

The disadvantage to constructing a light source of white continuous spectrum LEDs is that color variations can not be provided. When providing a lighting instrument constructed of a plurality of white LEDs it can be of great advantage to adjust the color temperature of the emitted light. This advantage is similar to the manual selection of prior art fluorescent lamps that are "cool white" or "soft white". By incorporating at least one additional wavelength light source such as an amber or yellow LED types, the perceived color of the light emitted by the white LEDs can be altered from a "cool" or bluish white to a "soft" or yellowish light. The white continuous spectrum LED and an additional wavelength LED may either be individual LEDs separately packaged and fixed to a substrate or they may be manufactured so that both LEDs are contained within a single housing and the housing is fixed to the substrate. It is known in the prior art to package two narrow band (colored LEDs) in a single package for ease of handling and mounting.

Black light projectors are often used in entertainment along with fluorescent paints that radiate when exposed to specific frequencies of ultraviolet light. Black light projectors emitting ultraviolet light in the frequency range of 350 to 400 nanometers are often constructed of arc lamps in cooperation with an optical black light filter. Another common source of black light projection is the glass tube type black light that is constructed to mount in a standard commercially available fluorescent tube socket.

A unique type of black light projector used for entertainment can be constructed of solid state ultraviolet LED light sources. These ultraviolet light sources emit a very narrow band of ultraviolet light. One such LED is manufactured by Nichia Chemical Industries LTD of Japan. Part number NSHU590 emits ultraviolet light at 370 nanometers. Since the ultraviolet light emitted has a very narrow bandwidth, the emitted energy does not reach into the visible at 400 nanometers. It is best to have a visible wavelength emission indicator to indicate that the ultraviolet LEDs are emitting. An emission indicator can be constructed of one or more visibly emitting blue LEDs. The emission indicator would be mounted on the black light projecting instrument's housing so as to be seen easily by an operator of the light. An example of a visible blue LED would be Nichia part number NSB500S. This blue LED wavelength centers itself around 465 nanometers. Any indicator of emission may be used including other colors of LEDs and other types of light sources. The blue LEDs may have a reduced output as to not attract great attention to the black light projector and risk a distraction during a performance, while still making it visible to theatrical lighting operators.

A black light projector constructed of ultraviolet LEDs has several advantages over the prior art devices. Conventional arc lamps used as the sources for black light projectors require high ignition voltages to "strike" the lamp into operation. These lamps often emit a wide range of energy, incorporating unnecessary wavelengths that are filtered out by optical filters. The unwanted energy is often absorbed by the optical filter and turned into heat.

Since ultraviolet LEDs emit only an ultraviolet spectrum to begin with, less energy is wasted as compared to other prior art light sources that use an optical filtering system. Also LEDs do not require costly high voltage ignition systems such as required by prior art arc lamp systems. To provide additional effects in a theatre setting, the ultraviolet LEDs used to provide a black light effect can be strobed or flashed rapidly without great additional expense as the power supply to the LEDs does not have to incorporate a high voltage ignition system like that required in prior art black light projectors using arc lamps. A system of black light projection can be incorporated into a multi-parameter light that can be controlled remotely and may include other parameters like pan, tilt, strobe and dimming. A multi-parameter black light projector has the advantage of instant light output as the ignition system and warm up period like that required by conventional arc sources is not required. Also it can be easily positioned remotely by pan and tilt mechanisms so the projected light can be directed from one location to another. This is helpful as one light may do the job of several lights that do not have the parameters of pan and tilt. Since the black light projector of the invention does not require a warm-up period and emits light only at the desired ultraviolet frequency, energy is saved and the heat generated at the location of use is reduced.

While transporting or handling the devices, LEDs are much less susceptible to impact damage than arc lamp and filter projectors and much more robust than commercially available glass tube type black lights.

In yet another embodiment of the invention multiple light sources are built into a multi-parameter light having variable parameters. The light sources as a single group or color may have their intensity varied simultaneously. For example, in prior art lighting instruments using an RGB system with a plurality of light sources, the Red wavelength group of light sources would have their intensity varied simultaneously and at the same intensity level. The lighting instrument of the invention would be capable of individually varying the intensity of the light sources of the same wavelength or color in relation to each other. Each individual light source of the same wavelength may be varied in relation to each other or subgroups of the same wavelength may be varied in relation to each other. It is preferred that the light sources are fixed to a flexible substrate or that they are mounted on a curved substrate. In this way the light sources are not emitting light parallel to each other. As the plurality of light sources project light onto a projection surface and each of the light sources intensity is varied in relation to each other, the projected light will vary in intensity across the projection surface. Various methods of controlling the intensity of the individual light sources may be used. One method well known to vary the intensity of LED light sources involves current control of the device. This method could be applied to multiple light source LED lights using multiple wavelengths as described above. The light that is projected on a surface by the plurality of light sources that incorporates control over the individual light source intensities may have a graduated intensity across the projection surface depending on what multiple light sources has their intensity varied.

The present invention in various embodiments also provides for individual dimming of light sources.

The multiple LED light sources may also be flashed as to cause stroboscopic effects. The stroboscopic flash rates may be controlled from a theater remote control system. The stroboscopic flash rate of the multi-parameter light being controlled from a microprocessor that is an integral part of the lighting instrument. Other functions of a multiple light source multi-parameter light may include but are not limited to pan, tilt, dimming, strobe, focus, color adjustment and variable diffusion.

In yet another embodiment of the invention a variable light diffusing filter is included after the light sources. The variable light diffusing filter may be a variable filter such as a liquid crystal emulsion spread between sheets of conductive plastic. These filters are voltage controlled and in one state allows light to pass through a clear window. In another state (controlled by voltage) the light is scattered. When varying the controlling voltage to the liquid crystal filter it is possible to achieve variations in the amount of light being scattered. This is particularly useful as one parameter of a multi-parameter light, as the projected light can be varied in the softness of the edge of the projected light. A filter such as that described above is available form Edmond Scientific of Barrington N.J. and is manufactured by the 3M company.

The multiparameter lights of the invention disclose apparatus and methods for utilizing as the light source a plurality or light sources, in a multiparameter light while enabling the light generated by the plurality of light sources to be varied as to alter the focus, color, position and intensity of the projected light.

BRIEF DESCRIPTION OF THE DRAWINGS

FIG. 3D illustrates another substrate in accordance with an embodiment of the present invention;

FIG. 8 Illustrates a multiparameter lighting device of an embodiment of the present invention using white LEDs along with amber LEDs.;

FIG. 12A shows an apparatus which is a further embodiment of the present invention which includes a multiparameter lighting device and a variable diffusion filter;

FIG. 12B shows the apparatus of FIG. 12A in a different state; and

DETAILED DESCRIPTION OF THE DRAWINGS

Figure 1:
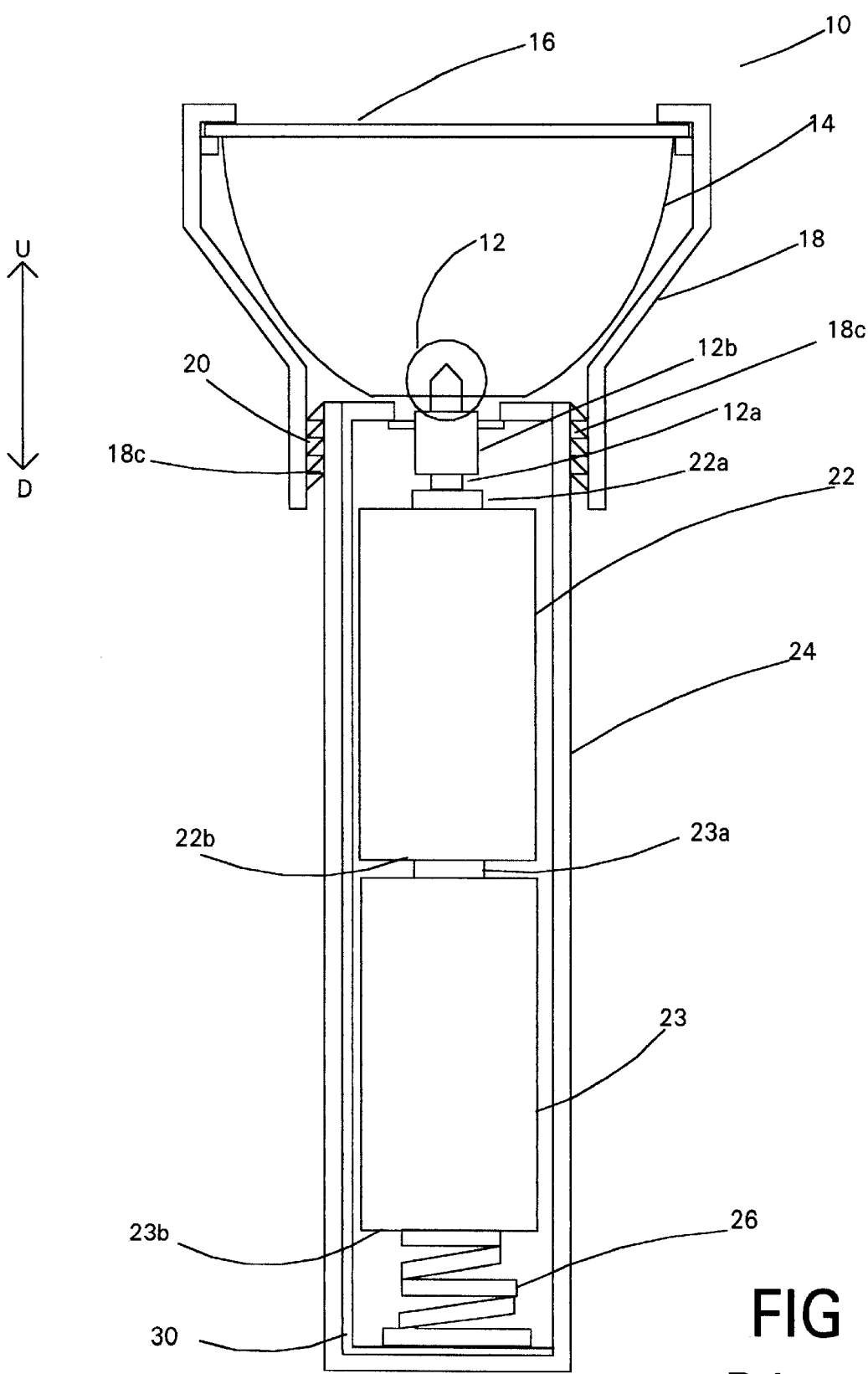
FIG. 1 illustrates a flashlight of the prior art.

FIG. 1 illustrates a flashlight 10 of the prior art. The flashlight 10 is comprised of a lamp 12, a reflector 14, a cover 16, a threaded holder 18, threads 20, batteries 22 and 23, case 24, a spring 26, and a conductor 30. The threaded holder 18 has internal grooves 18c which can be threaded or screwed onto threads 20 which are mounted to the case 24. The cover 16 may be transparent.

The lamp 12 has a terminal 12a which is electrically connected to a terminal 22a of the battery 22. The battery 22 has another terminal 22b which is electrically connected to a terminal 23a of the battery 23. The battery 23 has another terminal 23b which is electrically connected to the spring 26. Spring 26 is electrically connected to conductor 30 which connects to a second terminal 12b of the lamp 12 in order to complete a circuit.

The lamp 12 may be a single light source which in FIG. 1 is surrounded by the reflector 14. The reflector 14 directs the light energy emitted by the light lamp 12. The position of the reflector 14 relative to the lamp 12 can be shifted upwards or downwards by the threaded holder 18. For example, turning the threaded holder 18 counterclockwise causes the threaded holder 18 and the reflector 14 to move in the direction "U" shown in FIG. 1 and thus farther away from the lamp 12 which is fixed to the case 24. Similarly the threaded holder 18 when turned clockwise causes the threaded holder 18 and thus the reflector 14 to move in the direction "D" shown in FIG. 1 and thus closer to the lamp 12.

As the position of the reflector 14 is changed in relationship to the lamp 12, the light rays emitted by the lamp 12 intersect the reflector at different locations. In turn the light rays are either converged or diverged at a fixed location in front of the reflector 14. A current disconnection switch is not shown, however such a switch might typically be attached to conductor 30 or a sliding version of conductor 30.

Figure 2A:
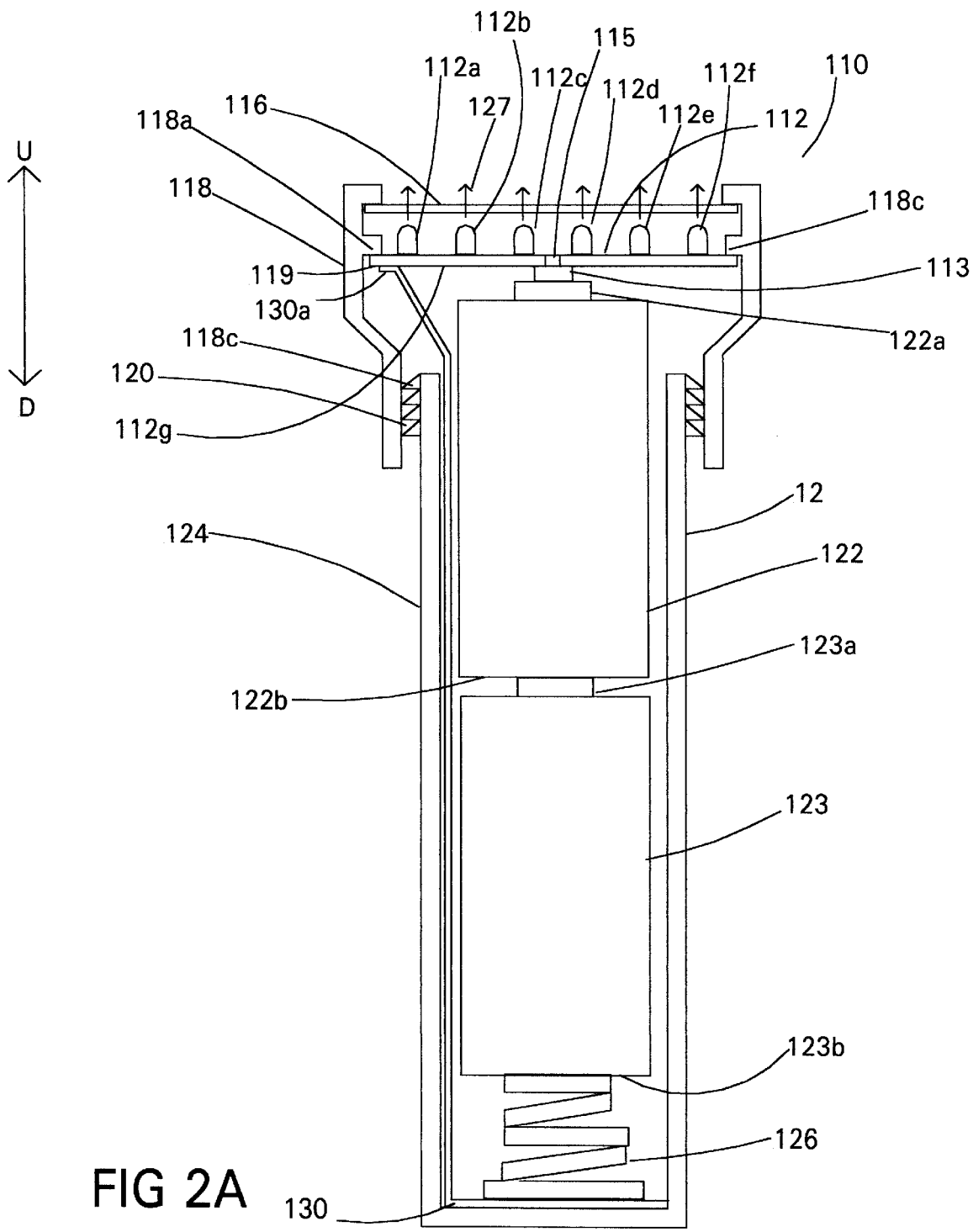
FIG. 2A illustrates a flashlight comprised of a flexible substrate having a plurality of light sources.

FIG. 2A illustrates a flashlight 110 that uses an embodiment of the invention. The flashlight 110 is comprised of flexible substrate 112 on which light emitting diodes 112a–112f are fixedly mounted. The flashlight 110 is also comprised of transparent cover 116, threaded holder 118, threads 120, batteries 122 and 123, a case 124, spring 126, and a conductor 130. The threaded holder 118 has internal grooves 118c which can be threaded or screwed onto the threads 120 which are mounted on the case 124. The flexible substrate 112 has a terminal 115 which is electrically connected to a terminal 113 which is electrically connected to a terminal 122a of the battery 122. The battery 122 has another terminal 122b which is electrically connected to a terminal 123a of the battery 123. The battery 123 has another terminal 123b which is electrically connected to the spring 126. Spring 126 is electrically connected to conductor 130 which a flat piece 130a which connects to flexible substrate 112 at a second terminal 119 in order to complete a circuit.

Lead wires for each of the diodes 112a–f which connect two terminals of each diode to either the terminal 119 or the terminal 115 may be passed through the flexible substrate 112 and soldered to a conductive lamination much in the same way that light emitting diodes are mounted to a conventional through hole circuit board. Each diode has two terminals, one terminal connected by a lead wire to terminal 119 and one terminal connected by a lead wire to terminal 115.

An array of light emitting diodes 112a–f are used. In a preferred embodiment the array of light emitting diodes are symmetrically disposed, i.e. this means that the distance between any two adjacent diodes, D1 shown in FIG. 2A, is the same for any two adjacent diodes. This helps to give a predicable result during the convergence or divergence. In FIG. 2A the light from each of LEDs 112a–f is basically focussed upwards as shown by arrow 127 which is pointing upwards in the "U" direction.

Figure 2B:
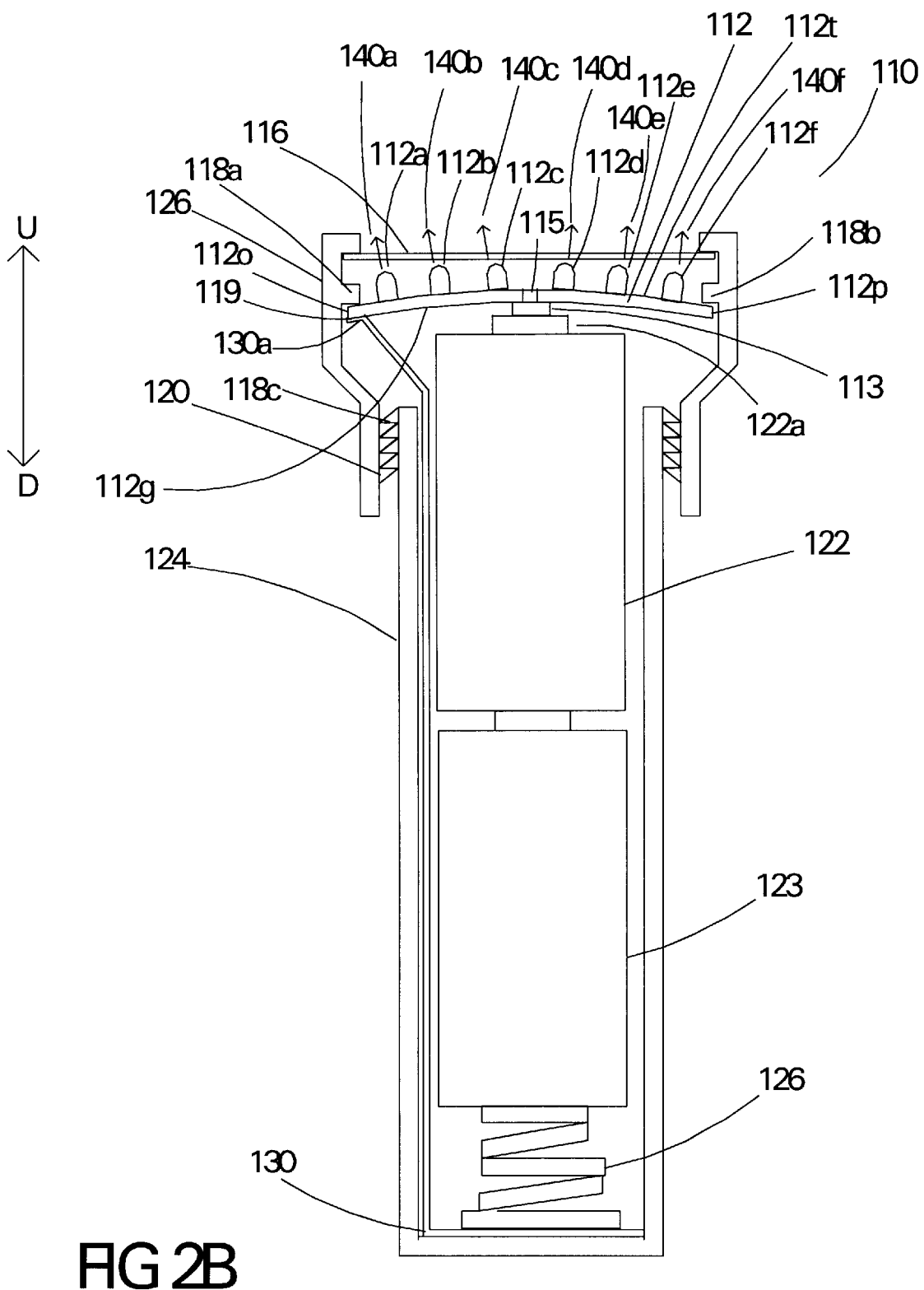
FIG. 2B Illustrates the same flashlight as in FIG. 2A with the light energy from the plurality of light sources having been redirected by deforming the flexible substrate.

FIG. 2B Illustrates the same flashlight 110 as in FIG. 2A with the light energy from the plurality of light emitting diodes 112a–f having been redirected by deforming the flexible substrate 112. This is accomplished by applying pressure to the center or the center region of the flexible substrate 112 (at about the terminal 115) causing the substrate 112 to become curved (or deformed) as shown in FIG. 2B. This pressure is accomplished by tightening the threaded holder 118 at the top of the flashlight 110. The threaded holder 118 has extensions 118a and 118b which force the periphery sections 112o and 112p, respectively downwards in the direction "D" when the threaded holder 118 moves downwards. The outer periphery of the flexible substrate 112 (at locations 112o and 112p) is forced down in the direction "D" while the center or center region of the flexible substrate 112, at terminal 115, is pushed upward in the direction "U" by the terminal 122a of the battery 122. The upwards pressure by the terminal 122a depends on the spring 126. The spring 126 would be selected to provide a force that is conducive with the flexible substrate 112, so that the flexible substrate 112 doesn't break. The spring 126 may be made of nickel plated carbon steel spring wire or other suitable material. Various components including the threaded holder 118, the battery 122, the battery 123, the battery terminal 122a, and the spring 126 may be considered part of an overall flexing device for this embodiment which causes the substrate 112 to flex.

It is possible to design a flexible substrate 112 that is the subject of the invention that may omit the battery contact spring 126 as the downward pressure supplied by the flexible substrate would be enough to supply the contact pressure for the batteries 122 and 123. Arrows 140a–f shown in FIG. 2B indicate the basic direction of the light energy emitted by the light sources 112a–f, respectively, i.e. the direction of light from source 112a would be shown by arrow 140a. The light from LED 112a which was previously focused directly upwards as shown by arrows 127 in FIG. 2A, is now shown pointing more towards the left in FIG. 2B. Light from LED 112f is now shown pointing more towards the right in FIG. 2B. Note that the light may actually be radiating in many directions but that the direction in which it is concentrated or primarily focused is illustrated by the various arrows such as arrows 140a–f.

A current disconnection switch is not shown but would be connected to conductor 130 or conductor 130 could actually be in two pieces which could be connected to provide current connection and disconnection.

FIG. 2B also shows the top side 112t of the flexible substrate 112. The diodes 112a–f are connected to the top side 112t.

Figure 3A:
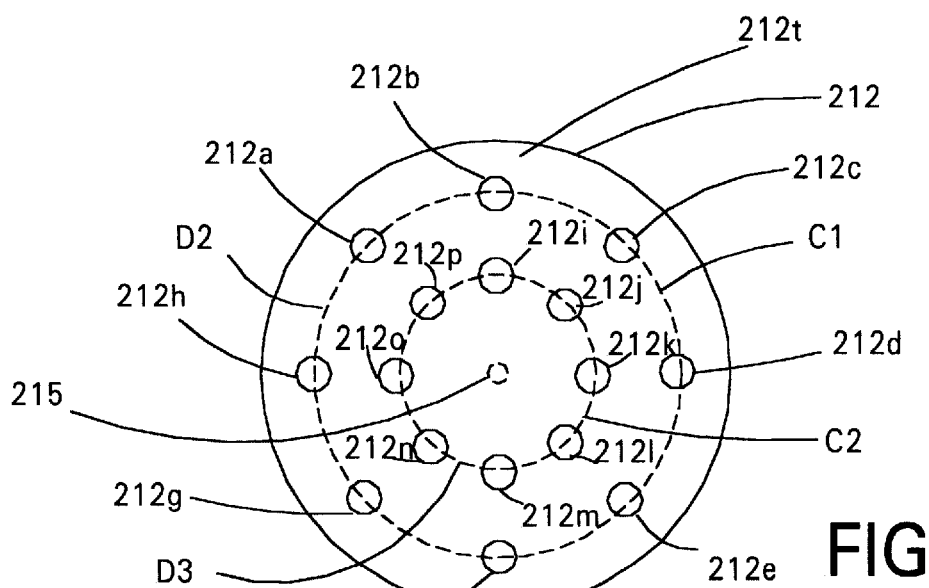
FIG. 3A illustrates a flexible substrate which can be used in the device of FIGS. 2A and 2B.

FIG. 3A illustrates the top side 212t of another flexible substrate 212, which can be used in place of the flexible substrate 112. The top side 212t would be positioned as the top side 112t is in FIG. 2B.

The flexible substrate 212 includes diodes 212a–p shown in FIG. 3A. The diodes 212a–212h are arranged around the periphery of the flexible substrate 212. The diodes 212l–212p are arranged more towards the center or center region of the flexible substrate 212. The distance D2 between adjacent diodes of the diodes 212a–212h can be the same for each pair of adjacent diodes, such as pair 212a and 212b. The distance D3 for between adjacent diodes of the diodes 212l–212p can be the same for each pair of adjacent diodes such as pair 212l and 212j. "Adjacent" for FIG. 3A means as one goes around the perimeter of either circle C1 or C2 as the case may be and not across the circle.

A top section of a contact area 215 is shown at the center of the substrate 212. The contact area 215 would be the same as the contact area 115 of FIG. 2A. The contact area 215 might be an electrically conductive rivet for example. Alternatively the contact area might only be the conductive material such as conductive material 254a shown in FIG. 3b and no specific contact is required.

Figure 3B:
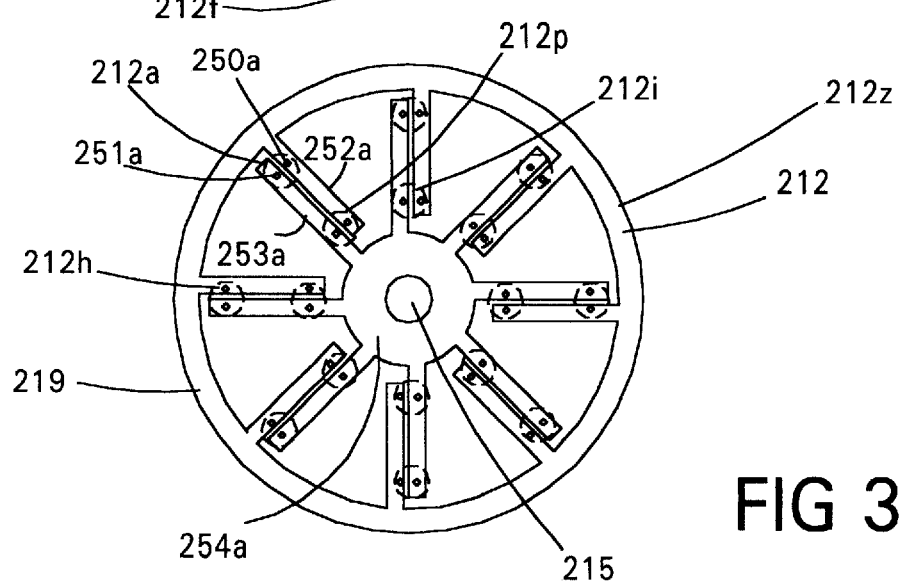
FIG. 3B illustrates the bottom of the flexible substrate of FIG. 3A.

FIG. 3B illustrates bottom 212z of the substrate 212. The bottom 212z shows contact 215 in the center of the flexible substrate 212. The bottom of LEDs 212a–h and LEDs 212l–p are shown. An LED 212a will be described but the other LEDs will be similar in terms of electrical connection. LED 212a has a terminal 250a and a terminal 251a. Terminal 250a is electrically connected to conductive material 252a which may be etched onto flexible substrate 212. Conductive material 252a is electrically connected to circular terminal 219 which is on the periphery of the flexible substrate 212. Circular terminal 119 of FIG. 2B could be basically the same as circular terminal 219.

Terminal 251a is connected to conductive material 253a which is connected to center conductive material 254a which is connected to terminal 215. Each of the LEDs 212a–p have similar electrical connections which allow the LEDs 212a–p to be electrically connected in a completed circuit and substituted for the flexible substrate 112 in FIG. 2B. The LEDs 212a–p may be soldered to the flexible substrate 212.

The conductive materials, such as materials 252a and 253a and 219 may be applied to either side of the flexible substrate 212. The LEDs 212a–p may be soldered or affixed to a conductive material that may be on the light emitting side (as in surface mount) or may mount through hole. LEDs are constructed with various mounting methods such as through hole type that consist of solderable leads that are usually soldered through a circuit board (which flexible substrate 212 may be) and surface mount types that are usually soldered to the same side of a circuit board.

The conductive materials (such as materials 252a–254a, and 219) may be applied to both sides of the flexible substrate 212 to aid in more complex circuit designs. In devices using multiple LEDs several discrete circuits of the light sources may be applied to the flexible substrate 212.

Figure 3C:
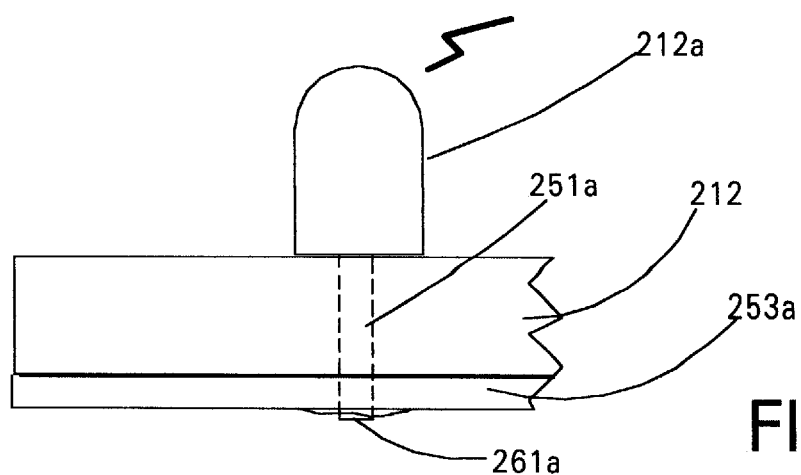
FIG. 3C Illustrates a small cross-section of the flexible substrate of FIG. 3A.
Figure 3E:
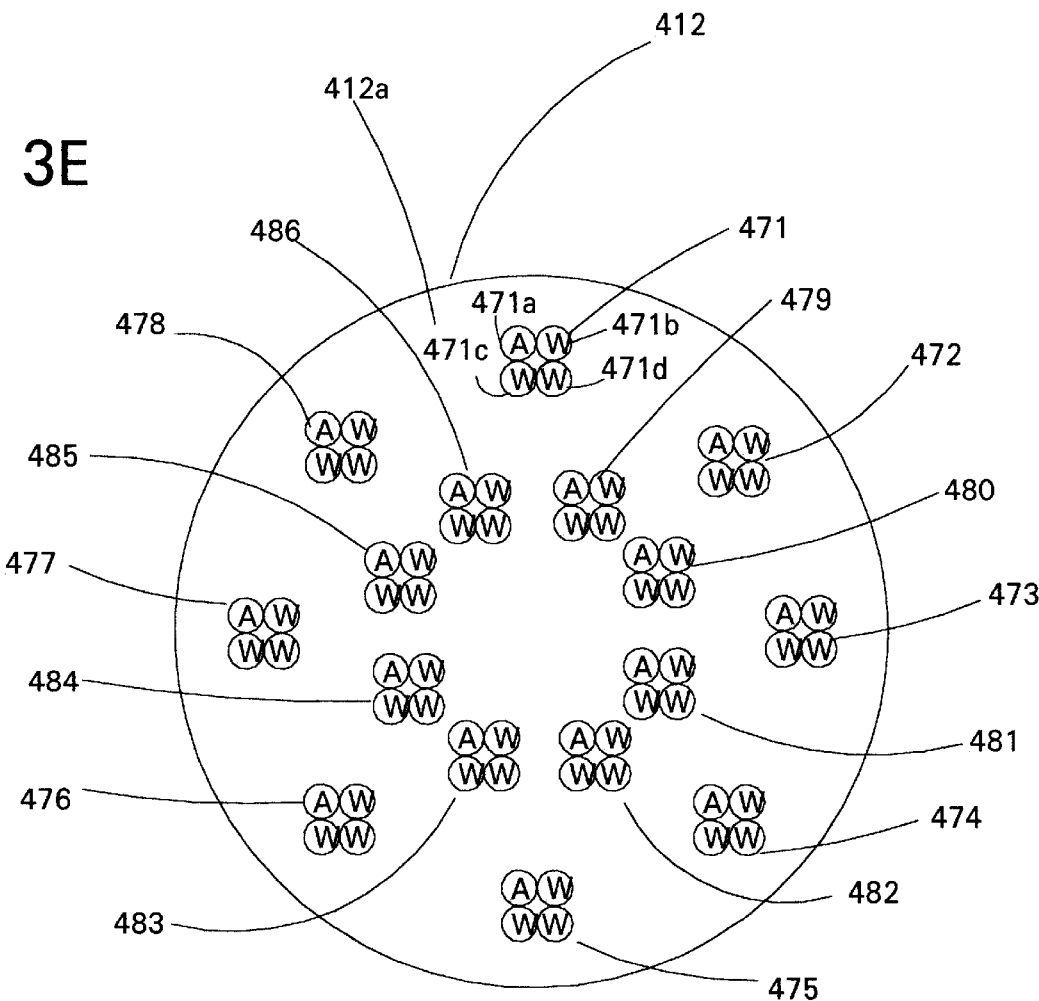
FIG. 3E illustrates another substrate in accordance with an embodiment of the present invention.
Figure 3F:
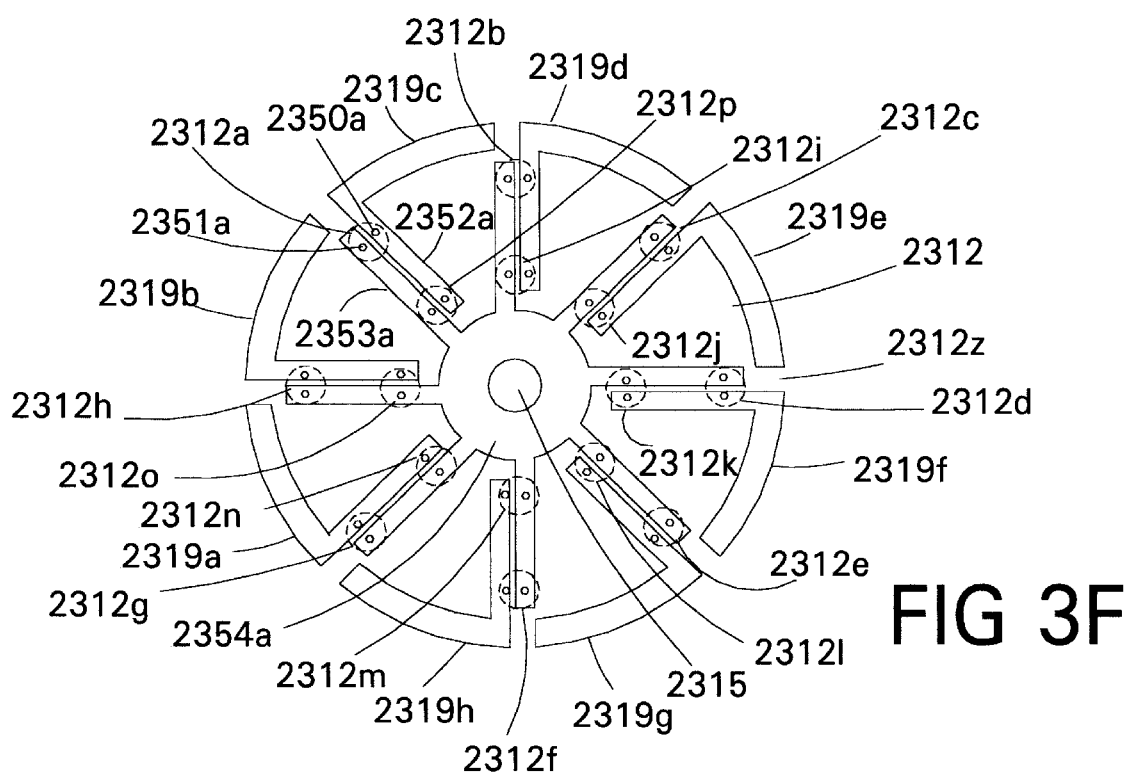
FIG. 3F shows the bottom of another substrate in accordance with an embodiment of the present invention where discrete circuits are used.

FIG. 3F illustrates bottom 2312z of the substrate 2312. The substrate 2312 differs from the substrate 212 of FIG. 3B in that 2312 shows discrete circuits instead of a circular terminal 119. There are eight discrete circuits shown. The bottom 2312z shows contact 2315 in the center of the flexible substrate 2312. The bottom of LEDs 2312a–h and LEDs 2312i–p are shown. An LED 2312a will be described but the other LEDs will be similar in terms of electrical connection. LED 2312a has a terminal 2350a and a terminal 2351a. Terminal 2350a is electrically connected to conductive material 2352a which may be etched onto flexible substrate 2312. Conductive material 2352a is electrically connected to terminal 2319c which is on the periphery of the flexible substrate 2312. Thus in FIG. 3F, the Leds 2312a and 2312p are in a discrete circuit which includes center contact 2315 and terminal 2319c. Similarly LEDs 2312b and 2312i are in a discrete circuit with center contract 2315 and terminal 2319d, LEDs 2312c and 2312j are in a discrete circuit with 2315 and terminal 2319e, LEDs 2312d and 2312k are in a discrete circuit with center contract 2315 and terminal 2319f, LEDs 2312e and 2312l are in a discrete circuit with 2315 and terminal 2319g, LEDs 2312f and 2312m are in a discrete circuit with center contract 2315 and terminal 2319h, LEDs 2312g and 2312n are in a discrete circuit with 2315 and terminal 2319a, LEDs 2312h and 2312o are in a discrete circuit with center contract 2315 and terminal 2319b.

The LEDs 2312a–p in FIG. 3F may be fixed to the substrate in the same manner as those in FIG. 3B. Each periphery terminal of terminal 2319a–h are insulated with respect to its adjacent terminals (i.e. terminal 2319a is insulated with respect to terminals 2319b and 2319h) by lack of conductive material. When electrical power is applied separately to one of peripheral terminals 2319a through 2319h as one point of contact while using common terminal 2315 as the other point of electrical contact, eight separate groups of LEDs can be individually energized. Also any combination or all groups may be energized at once by connecting across all periphery terminals. FIG. 3F shows two LEDs per circuit as an example however one LED per circuit or greater amounts than two LEDs per circuit may be controlled individually if the conductors on the substrate are so arranged. The electrical contacts may be substituted for conventional electrical connectors if desired.

FIG. 3B and FIG. 3F shows the light sources connected directly from one terminal of the power supply to another in parallel to simplify the drawing. Depending on the type and amount or light sources used and the voltage applied, the light sources they may or may not be connected in parallel. It is known in the art to connect LEDs to a current limiting resistor. In this case a resistor may be in series with each LED or with a group of LEDs. Combinations of series and parallel LEDs may be used. Various circuit designs may be used to connect the LEDs to the power source that are known in the art.

The LEDs may be controlled individually. In this way each LED's intensity (intensity is also meant to refer to on and off and or as well as brightness) could be varied per individual LED. These multiple discrete circuits formed in the conductive material could be used to provide access to different groups of the plurality of light sources. This could be an advantage when providing control access to multi color systems or different intensity levels of each specific color. The multiple circuits can also be used to control specific regions of the plurality of light sources. This is an advantage when controlling the illumination of an area that may require less illumination in one area and more illumination in another.

FIG. 3C Illustrates a small cross-section of the flexible substrate 212. The light emitting diode light source 212a, the flexible substrate 212, the terminal 251a, and the conductive material 253a are shown. The diode 212a is soldered to the flexible substrate 212 at the location 261a on the bottom side of the flexible substrate 212. LEDs 212b–212p may be similar in electrical connections and in manner of fixing to LED 212a.

FIG. 3D illustrates another embodiment of the invention. A substrate 312 is shown. The substrate 312 has mounted to it, in a fixed manner, LED groups 371 through 386, i.e. 16 groups of LEDs. Each LED group includes four LEDs. For example LED group 371 includes a red LED 371a, a green LED 371b, a blue LED 371c, and a white continuous spectrum LED 371d. The LED groups 372–386 are of the same type as groups 371 and include the same four LEDs in the same pattern.

In FIG. 3D the substrate 312 may or may not be flexible. It is preferred that the substrate be deformable so the light projected by the LEDs is not parallel to each other or at least a curved substrate. The plurality of light sources are arranged in a multi wavelength distribution pattern. (I.e. different colors means different wavelengths). In this drawing separate wavelengths or (colored light sources) are used. The colors red, blue and green are used to promote additive color mixing. The general process of additive color mixing is well known in the art. A white light source such as led 371d in FIG. 3D may also be used along with the red, green and blue to increase the overall amount of the white light intensity and to aid in creating more variations in the shades of pastel colors. The addition of white light to say a red color emitted by the red light sources, dilutes the red light. If for example some or all of the red light sources on substrate 312 are energized and the white light intensity of some or all of the white light sources is increased slowly by the use of a solid state current control system, an adjustable dilution can be achieved. The design of electronics that provide variable current to LEDs to be controlled is well known in the art, in a general sense and can be accomplished many different ways.

Each LED of the groups of LEDs shown in FIG. 3D are individually controllable by electronic circuitry which may be similar to that of FIG. 3F or with some other circuitry. For example, white LED 371d is individually controllable so that it can be turned on and off individually. The light sources (also called LEDs) in groups 371–386 are mounted to a surface 312a of the substrate 312. The surface 312a may be a flat substrate, a deformable substrate or curved surface. Using individual circuits each individual light source, as light source 371d, may be separately controlled. The control of each light source might be variable such as a gradual change of intensity from an off state to full brightness, as to provide intensity control to each lamp or simply the switching of each light source off or on. If the light sources in groups 371–386 are projected on a surface to be illuminated the individual control of each light source will provide changes in the intensity and color of the pattern that is projected on the surface.

An example of the uses of the individual control of the light sources of groups 371–386 might be during a photography shoot. The illumination device containing the multiple light sources with multiple wavelengths that have individual control of the sources of each wavelength is projected upon the set behind a subject. If the photographer or director wishes to provide a look like a setting sun using the invention like that described in FIG. 3D, the red light sources of groups 374, 375, and 376 at the bottom of the substrate 312 may be energized, while the other light sources of groups 374, 375, and 376 (white, blue, green) are not energized. As we move up across the substrate of FIG. 3D we see that 381, 382, 383, and 384 also have their red light sources energized along with the green light sources of 381, 382, 383, and 384. The red light sources may be energized at 100% while the green light sources may be energized at 50%. This results in a perceived additive color mixing in the locations or 381, 382, 383, and 384 of an orange color.

As we move up to the other groups of groups 371, 372, 373, 377, 378, 379, 380, 385 and 386 shown in FIG. 3D have their respected light sources at 100% red and 100% green resulting in a perceived additive color mix of yellow. In this way the surface to be projected upon results in a red to yellow fade across the projection surface emulating a sunset for the photographer or director.

FIG. 3D illustrates that the individual wavelengths (i.e. colors) have individual control between the same wavelength. This could be provided so that every single light source of a wavelength has separate control or groups of the same wavelength have control.

FIG. 3E illustrates a substrate 412 on which groups 471–486 of LEDs are mounted. Each group contains the same LEDs as will be illustrated by a description of group 471. Group 471 includes an "A" LED 471a, and three white LEDs 471b–d. Groups 472–486 have the same LEDs which are arranged in a similar manner.

The surface 412a of the substrate 412 may be a flat substrate, a deformable substrate or curved surface. It is preferred that the substrate be deformable so the light projected by the LEDs is not parallel to each other or at least a curved substrate. The substrate 412 has mounted thereon primarily white continuous spectrum light sources in groups 471–486. An additional wavelength is also provided as to shift the perceived color temperature of the continuous spectrum white light, i.e. LED 471a. The invention may have individual circuits like that described above in FIG. 3D.

The use of white light source LEDs is an advantage over a color additive system constructed of red, green, and blue light sources. The white light sources can provide a continuous spectrum of visible white light. This can be an advantage when lighting critical objects of various colors.

Figure 4A:
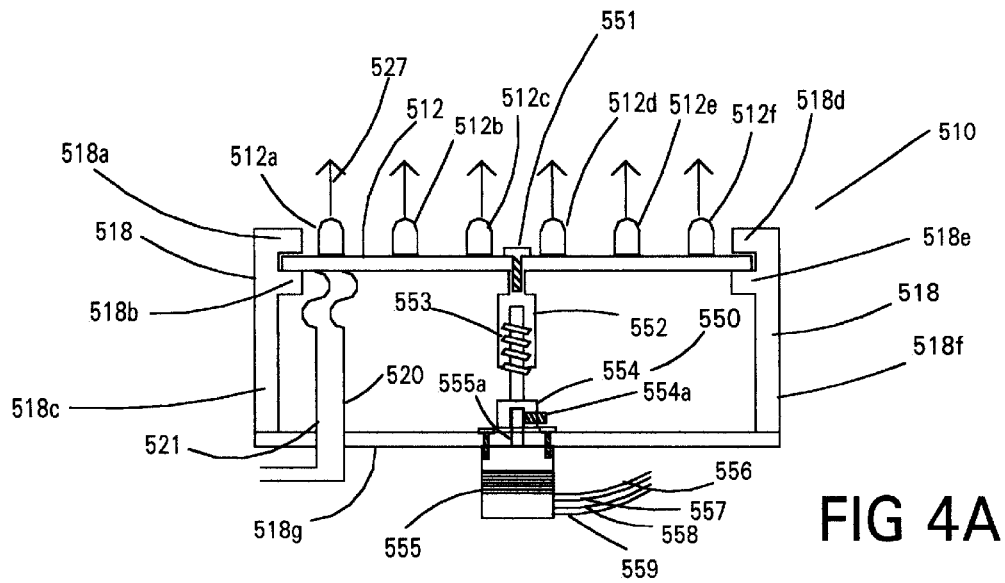
FIG. 4A Illustrates a stepper motor driven converging and diverging apparatus.

FIG. 4A Illustrates a stepper motor driven converging and diverging apparatus. The apparatus is comprised of a housing 518, a stepper motor device (which will be described as including components in addition to the stepper motor), and a flexible substrate 512. Other types of motors could be used such as a servo motor instead of a stepper motor.

The stepper motor device 550 includes a fastener 551, a powernut 552, a motor driven lead screw 553, a hub 554 with a set screw 554a, a stepper motor 555, and motor energizing conductors 556, 557, 558, and 559.

The fastener 551 is connected to the center of the substrate 512. The fastener 551 is connected to the powernut 552. The powernut 552 is shown threaded by the motor driven lead screw 553. The lead screw 553 is shown coming out of the hub 554 which includes the set screw 554a. The setscrew 554a sets the lead screw on top of the motor shaft 555a. The motor shaft 555a comes out of the motor 555. The motor 555 has wound around it motor energizing conductors 556, 557, 558, and 559.

The housing 518 is comprised of left extensions 518a and 518b, left arm 518c, right extensions 518d and 518e, right arm 518f, and right base 518g. The substrate 512 has mounted thereon LEDs (light emitting diodes) 512a–512f. Wires 520 and 521 are used to supply current to and to complete a circuit from the diodes to a power source not shown in FIG. 4A, which may be batteries or another power source.

Arrows, such as arrow 527 indicate the general direction of the light energy or where the light energy is concentrated. FIG. 4A shows the light sources emitting light perpendicular to the substrate 512 and to the base 518g of the housing 518.

Figure 4B:
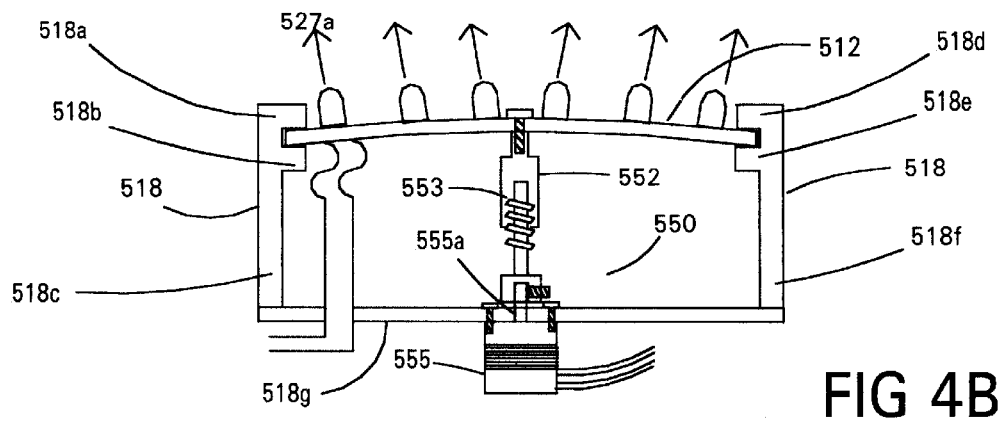
FIG. 4B Illustrates the mechanism of FIG. 4A in a different state.

FIG. 4B Illustrates that the leadscrew 553 has been partially unthreaded from the power nut 552 by the motor 555. In turn the power nut 552 is applying an upward force to the flexible substrate 512 causing the light from the light sources 512a–512f to diverge away from the former direction of perpendicular to the base 518g of FIG. 4A as shown by arrow 527a in FIG. 4B. Note that the extensions 518a and 518b and extensions 518d and 518e hold the periphery of the substrate 512, while the stepper motor device 550 pushes the center of the substrate upwards in the direction "U".

Figure 4C:
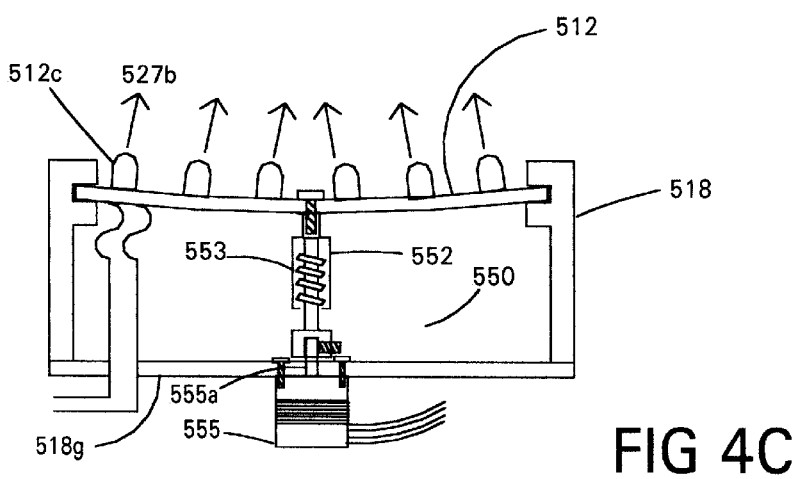
FIG. 4C Illustrates the mechanism of FIG. 4A in a different state.

FIG. 4C Illustrates that the leadscrew 553 has been threaded further into the powernut 552 by the motor 555. In turn the powernut 552 is applying a downward force to the flexible substrate 512 causing the light sources 512a–f to converge towards the center of the substrate 512. I.e. arrow 527b shows that the direction of the light from source 512a has moved towards the right of perpendicular to the housing base 518g. (The light is actually also perpendicular to the substrate at any particular point because the substrate is deformed, but it changes direction with reference to the base 518g).

Figure 5A:
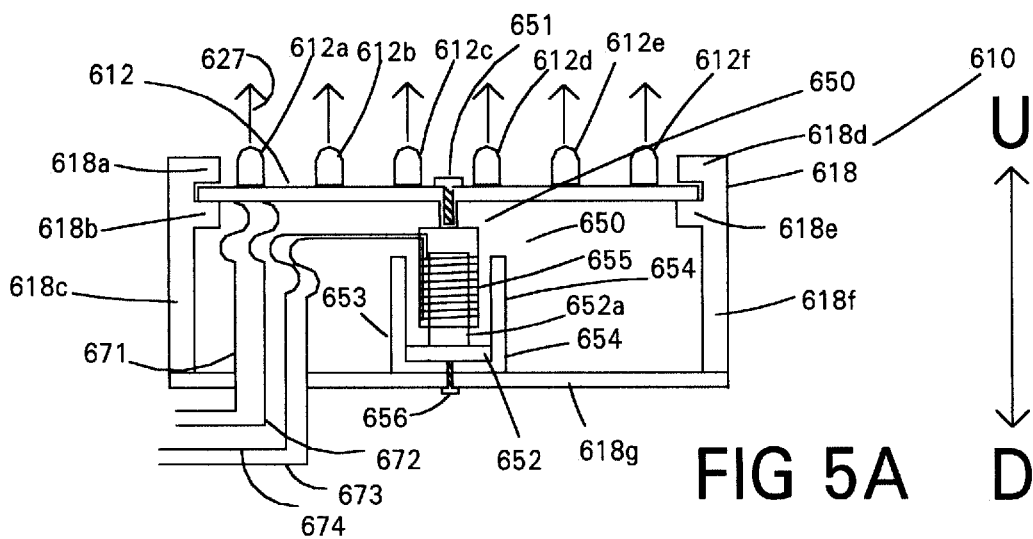
FIG. 5A illustrates an electromagnetic converging and diverging apparatus.

FIG. 5A illustrates an electromagnetic converging and diverging apparatus 610. The apparatus 610 is comprised of substrate 612, housing 618 and electromagnetic device 650.

The substrate 612 has mounted thereon LEDs 612a–612f. Each emits light concentrated in direction shown by an arrow emanating from it. LED 612a, for example emits light in the direction, or concentrated in the direction of arrow 627.

The housing 618 has extensions 618a, 618b, 618d, 618e, and arms 618c and 618f, as well as base 618g.

The electromagnetic device includes a fastener 651, a permanent magnet 652 sandwiched by the pole 652a and two outer magnetic structures 653 and 654, a coil with bobbin 655, and a screw 656 for attaching the permanent magnet structures to the base 618g of the housing 618.

The fastener 651 is connected to the coil with bobbin 655. The two outer magnetic structures 653 and 654 surround the permanent magnet 652 and coil with bobbin 655.

The apparatus 610 in FIG. 5A operates by applying electrical current to the coil 655 through wires 673 and 674. When no current is applied to the coil 655 the flexible substrate 612 is in a natural resting position as shown in FIG. 5A. As direct current is applied to the coil 655 it will either push on the substrate 612 or pull on the substrate 612 depending on the polarity. This can be seen as particularly useful as high speed converging and diverging mechanisms can be created. (I.e. the light sources can converge and diverge from the center of the substrate 612 at a high rate of speed). Various other methods of using magnetic force could also be created along the same scope.

Figure 5B:
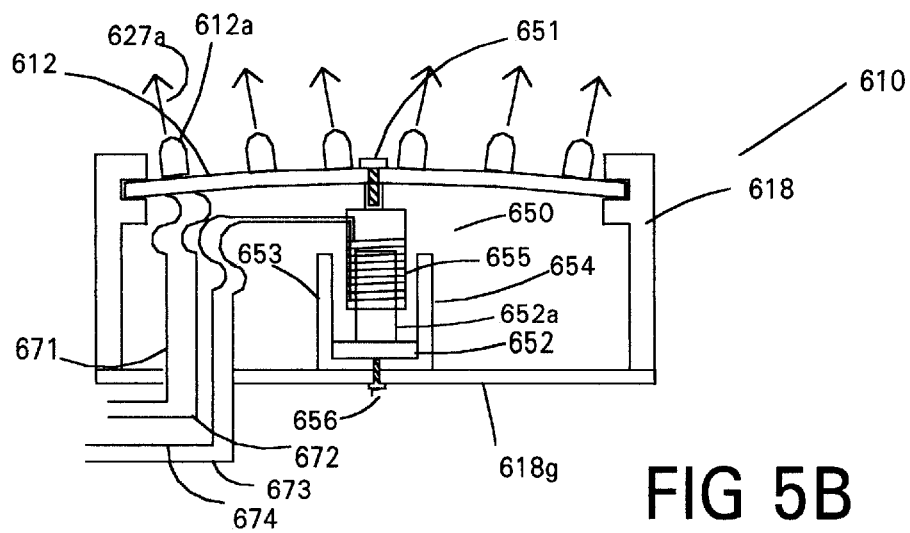
FIG. 5B Illustrates the apparatus of FIG. 5A in a different state.

FIG. 5B Illustrates the magnetic apparatus 610 as energized by a direct current through the coil 655 of one polarity. The light sources 612a–f are diverging from the center of the substrate 612, as shown by arrow 627a showing the direction of the concentration of light from light source 612a.

Figure 5C:
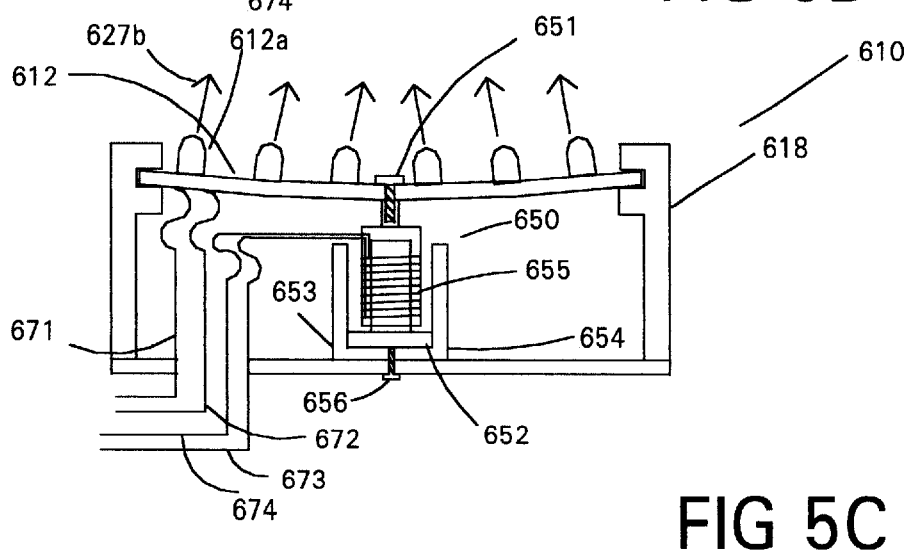
FIG. 5C Illustrates the apparatus of FIG. 5A in a different state.

FIG. 5C Illustrates the magnetic apparatus 610 as energized by a direct current of a reverse polarity from the polarity used in FIG. 5B. The light sources 612a–f are converging on the center (where fastener 651 is located) of the substrate 612, as shown by arrow 627b, which shows the direction of concentration of light from light source 612a.

Figure 6A:
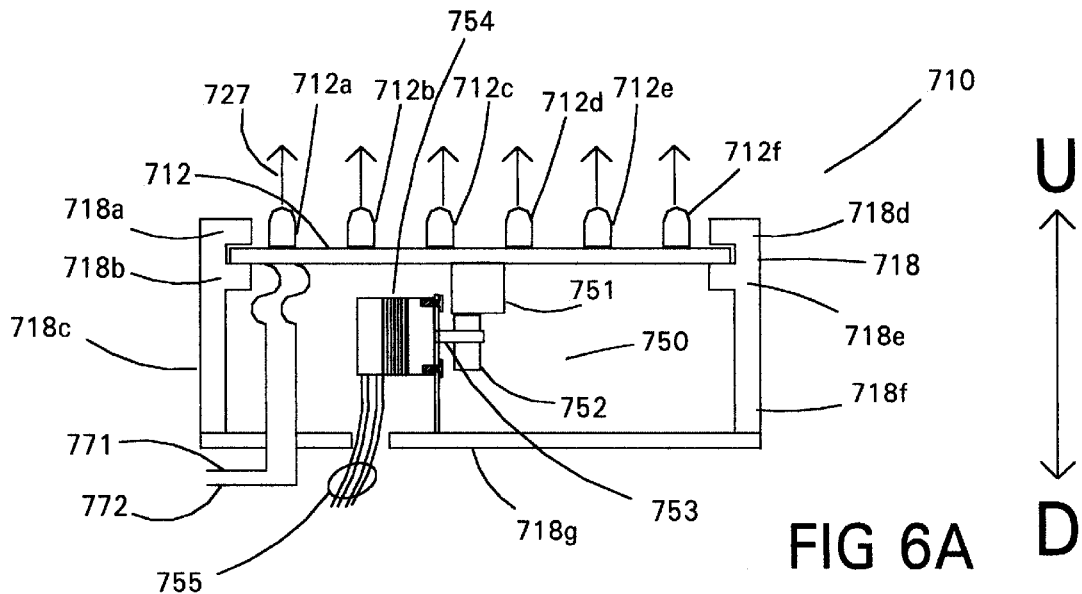
FIG. 6A illustrates an apparatus comprised of a cam system driven by a stepper motor.

FIG. 6A illustrates an apparatus 710 comprised of a cam system driven by a stepper motor. Alternatively, motors, other than a stepper motor, can be used. Apparatus 710 is comprised of flexible substrate 712, housing 718, and a device 750.

The flexible substrate is comprised of light sources 712a–f. The housing 718 is comprised of portions 718a–g basically as previously mentioned with reference to FIG. 5A.

The device 750 is comprised of cam hub 752, a bearing block 751, a shaft 753, a stepper motor 754 and a conductors 755. Conductors 755 are used to energize the motor 754. The bearing block 751 is fixed to the substrate 712. The cam hub 752 is engaged with the bearing block 751 and the cam hub is attached to the stepper motor 754. The conductors 755 may be wound around the stepper motor 754.

Wires 771 and 772 are used to provide current to the light sources 712a–f. Wires 671 and 672 are used to provide current to light sources 612a–f in FIGS. 5A–C. Wires 571 and 572 are used to provide current to light sources 512a–f in FIGS. 4A–C.

Figure 6B:
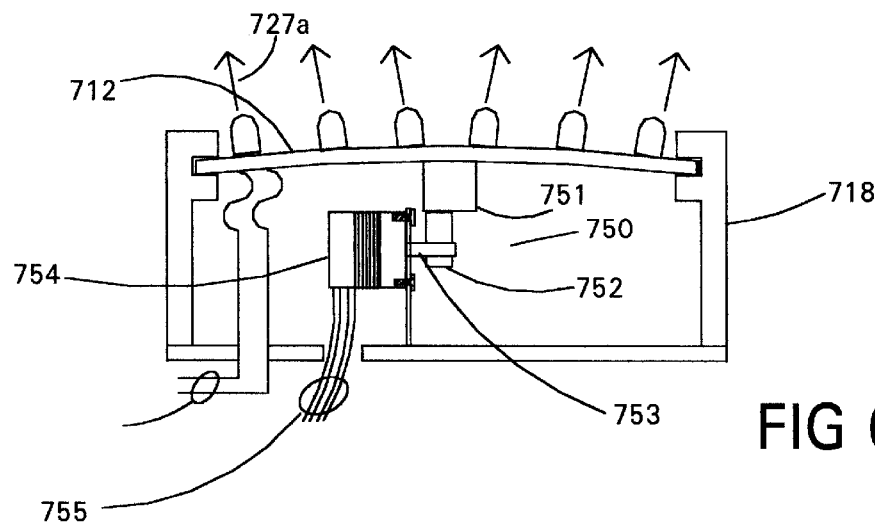
FIG. 6B illustrate the apparatus of FIG. 6A in a different state.
Figure 6C:
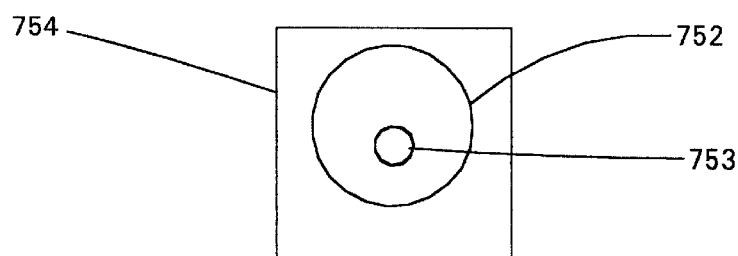
FIG. 6C shows a portion of the apparatus of FIG. 6A.

The cam hub 752 is non-concentric and the cam hub 752 acts to apply more or less pressure to the deformable substrate 712. As the hub 752 rotates against the surface of the bearing block 751 shown, the pressure of the cam hub 752 against the bearing block 751 changes. In the FIG. 6A–B drawings a push only system is shown. FIG. 6B illustrates the pressure applied to the deformable substrate 712 by the cam hub 752 after the motor shaft 753 and the cam hub 752 has rotated by 180 degrees. FIG. 6C illustrates a stepper motor 754 with a cam hub 752 attached to the motor shaft 753.

Other types of motors might be used instead of the stepper motor 754. For instance a DC servomotor could be used and the substitution for a stepper motor is well know in the art.

Figure 6D:
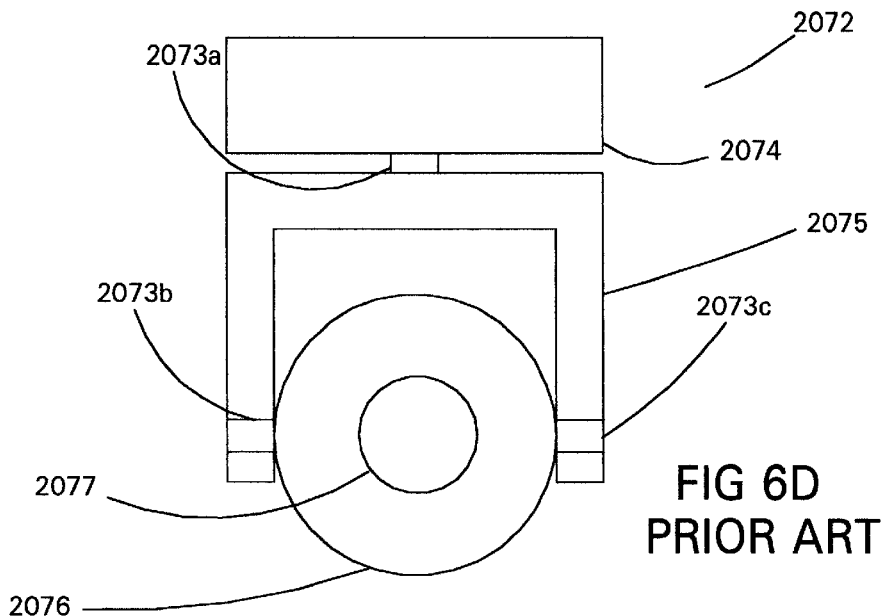
FIG. 6D shows an external view of a prior art multiparameter light.

FIG. 6D shows an external view of a prior art multiparameter light 2072. The multiparameter light 2072 includes bearing arrangements 2073a, 2073b, and 2073c, electronics housing 2074, a yoke 2075, a lamp housing 2076 and aperture 2077.

The electronics housing 2074 houses electronics components which control a lamp, not shown, inside the lamp housing 2076. The bearing arrangement 2073a connects the yoke 2075 that in turn connects the lamp housing 2076 by use of the additional bearing arrangements 2073b and 2073c. Light is emitted through aperture 2077.

Figure 6E:
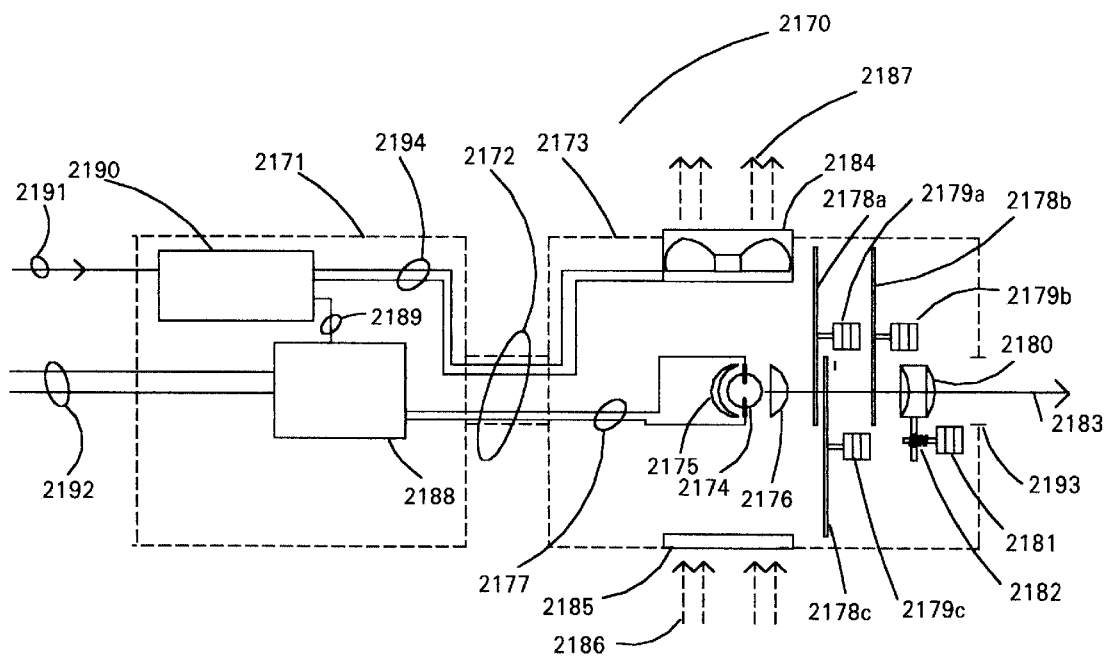
FIG. 6E shows a simplified drawing for illustrative purposes of a prior art multiparameter light.

FIG. 6E shows a simplified drawing for illustrative purposes of a prior art multiparameter light 2170. The multiparameter light 2170 includes electronics housing 2171, lamp housing 2173, lamp 2174, light collecting mirror 2175, condensing lens 2176, optical modifying wheels 2178a, 2178*b,* and 2178*c,* motors 2179*a* through 2179*c,* focussing lens 2180, and fan 2184.

The electronics housing component includes microprocessor 2190 and a lamp power supply 2188. An electrical connection 2189 (which may be a data bus) is shown connecting the microprocessor section 2190 to the lamp power supply 2188 that would allow communication between the microprocessor section 2190 and the power supply 2188 to control the enabling of the lamp 2174. The electronics housing 2171 is connected to the lamp housing 2173 by a bearing arrangement 2172 that is shown simplified for illustrative purposes. Lamp power wire 2177 and fan electrical wires 2194 supply power to the fan 2184 and wires 2177 and 2194 run through the bearing arrangement 2172. The bearing arrangement 2172 allows the housing 2173 to swivel in relation to the electronics housing 2171. Motors (not shown for simplification) are used to remotely swivel the lamp housing 2173 and direct the light emitted by the lamp housing 2173 in relation to the electronic housing 2171. More than one swivel point may be provided to provide panning and tilting of the multiparameter light 2170.

The lamp 2174 has its energy collimated by the light collecting mirror 2175 and the condensing lens 2176. The light energy travels in the direction of the arrow 2183. Optical modifying wheels 2178*a* through 2178*c* modifies the light with color filters, stencil patterns, prisms or neutral density filters. The optical modifying wheels are driven by motors 2179*a* through 2179*c.* A focusing lens 2180 is shown that has its position remotely changed to vary the focus of the light by motor 2181 and a lead screw system 2182. The light exits as shown by the arrow 2183 through exiting aperture 2193.

A ventilation system is provided with the inlet to the housing 2185 and entering airflow 2186. The fan 2184 pulls the entering air 2186 through the housing 2173 and the air exits in the direction shown by arrows 2187 through the fan 2184. Wire 2191 is a communication connection to microprocessor section 2190 and wires 2192 represent connection to a power source not shown.

Figure 7A:
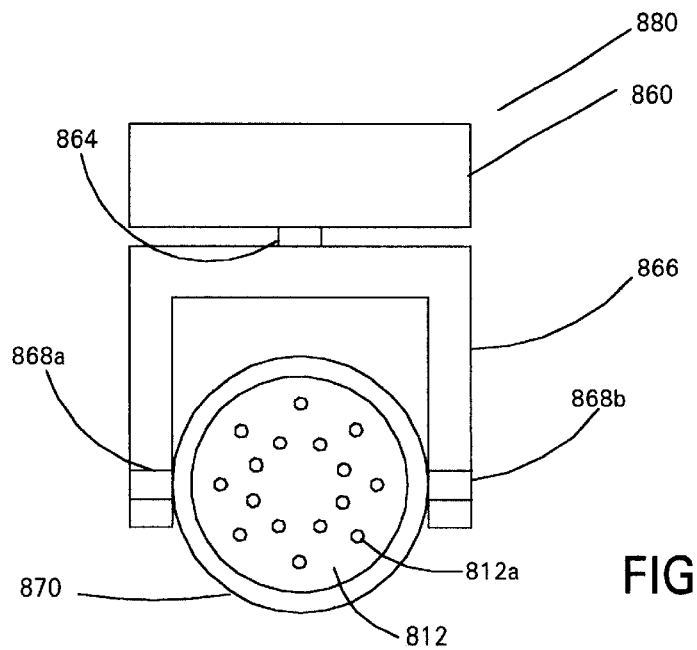
FIG. 7A shows a substrate which is the same as the substrate of FIG. 3A incorporated into a multi-parameter light.

FIG. 7A shows a substrate 812 which may be constructed similar as the substrate 212 shown in FIGS. 3A, 3B, and 3C but which is shown in FIG. 7A as used in a multi-parameter light 880. The substrate 812 may differ slightly from the substrate 212 in that the electrical connection points on the substrate may be connected by an electrical connector to the multiparameter lights internal power supply instead of connection to a battery source. The substrate 812 includes light sources the same as light sources 212*a*–212*p* in FIG. 3A, including light source 812*a* which is shown.

The multi-parameter light 880 includes electronic housing 860, yoke 866, bearing arrangement 864, lamp housing 870, and bearing arrangements 868*a* and 868*b.* The electronic housing 860 can also be called a "base". The "base" 860 as simply a base for attachment of the other housing 870 and the electronics or part of the electronics may actually reside outside of the housing 860.

The electronics housing 860 is connected to a yoke 866 by a bearing arrangement 864 shown here simplified for illustrative purposes. The yoke 866 is connected to the lamp housing 870 by additional bearing arrangements 868*a* and 868*b.* The bearing arrangements 864, 868*a* and 868*b* allow the lamp housing 870 to pan and tilt the light emitted by the lamp housing 870 in relation to the electronics housing 860.

Figure 7B:
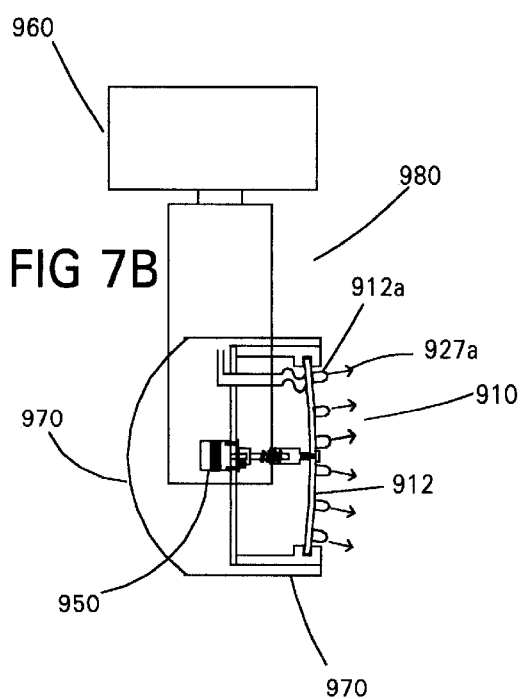
FIG. 7B shows an apparatus which is the same as the apparatus of FIG. 4A but which has been incorporated into a multi-parameter light.
Figure 7C:
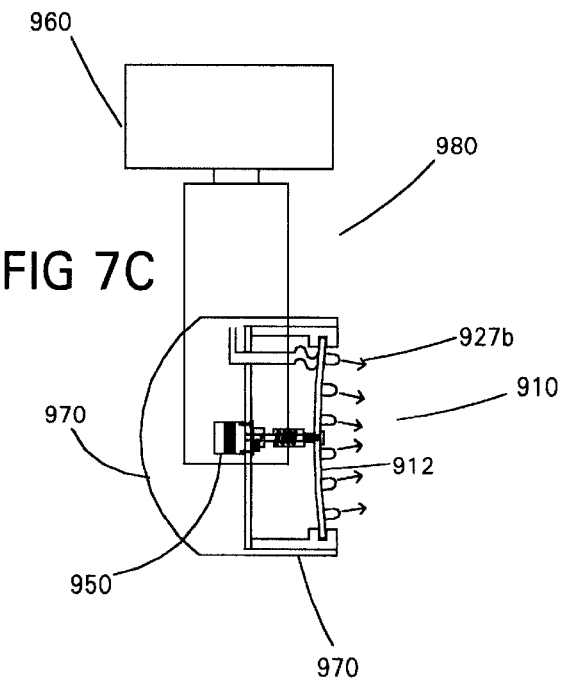
FIG. 7C shows the light sources converging towards the center of the substrate.

FIG. 7B shows an apparatus 910 which is the same as the apparatus 510 of FIG. 4A. The apparatus 910 has been included in a multi-parameter lighting device 980. The apparatus 910 includes the substrate 912, motor 950, and these components are the same as similarly numbered components in FIG. 4A. Shown in the FIG. 7B device 910 is LED 912*a* with an arrow 927*a* emitting from it, indicating the direction of the emitted light and the substrate 912. In FIG. 7B, the light sources are shown diverging from the center of the substrate 912 which is the same as in FIG. 4B. FIG. 7C shows the light sources converging towards the center of the substrate 912 which is the same as in FIG. 4C. FIG. 7B may be incorporated together with FIG. 7A, where the substrate 912 is the substrate 812 and where FIG. 7B is a side view of FIG. 7A. FIG. 7B shows electronic housing 960 and lamp housing 970 (which may be the same as housings 860 and 870, respectively, in FIG. 7A).

FIGS. 7A–7C refer to multiparameter lighting devices. The front of the multi-parameter lighting device 880 may be the same or similar to the front of the multi-parameter lighting device 980, however there may be a different number of light sources, i.e. substrate 812 may have a different number and pattern of light sources from substrate 912. The substrates 812 and 912, instead of the LED patterns shown, may have a different number of light sources or patterns and may incorporate embodiments like that shown in FIGS. 3D and 3E.

FIG. 8 Illustrates a multiparameter lighting device 1050 of the present invention using white continuous spectrum LEDs along with amber spectrum LEDs. The multiparameter lighting device 1050 includes a substrate 1012 which may be similar to the previous substrates except for the number and types of LEDs provided. The substrate 1012 may be deformed by a motor or as previously described in for example, FIGS. 4A–C, 5A–C, or 6A–B.

The LEDs on the substrate 1012 are arranged in a particular pattern. A first set of amber spectrum LEDs 1012*a* are arranged on the periphery of an outermost circle C1 on the substrate 1012. (The circle C1 and other circles doesn't physically appear and is for description purposes). Each pair of adjacent amber LEDs of the first set 1012*a* along the circle C1 are separated by the same distance. "Adjacent " LEDs with reference to this figure does not include LEDs adjacent across the circle C1 but only adjacent along the circle C1.

A first set of white continuous spectrum LEDs 1012*b* are arranged on the periphery of a circle C2 (again for descriptive purposes) on the substrate 1012. The circle C2 is smaller than the circle C1 and concentric with the circle C1. Each pair of adjacent white LEDs of the first set 1012*b* along the circle C2 are separated by the same distance D12.

In one embodiment, the amber LEDs and the white LEDs should to be dispersed as to cause an even illumination of the mixed light. The ratio of Amber LEDs to White LEDs may vary. It depends on the amount of light emitted by the white and amber LEDs. The distribution of amber and white LEDs in FIG. 8 provides an even illumination of mixed light within the meaning of the present application.

A second set of white continuous spectrum LEDs 1012*c* are arranged on the periphery of a circle C3 (again for descriptive purposes) on the substrate 1012. The circle C3 is smaller than the circle C2 and concentric with the circle C2. Each pair of adjacent white LEDs of the second set 1012*c* along the circle C3 are separated by the same distance D13.

At the center of all of the circles C1, C2, and C3 is an amber spectrum LED 1012*d.* The purpose of this arrangement of LEDs is simply to disperse amber spectrum LEDs and white continuous spectrum LEDs in a logical order so that a uniform color of light is emitted. The amber LEDs could be located between each white LED or between every two white LEDs and so forth. Again, in some embodiments it is preferred to cause an even field of illumination emitted by the mixed light.

The FIG. 8 embodiment also shows components whose identical or substantially identical counterparts have been previously described in other figures. The multiparameter lighting device 1050 includes electronics housing 1020, yoke 1022, and lamp housing 1024. A simplified bearing arrangement 1021 connects the electronics housing 1020 to the yoke 1022. Simplified bearing arrangements 1023a and 1023b connecting the yoke 1022 to the lamp housing 1024.

Figure 9A:
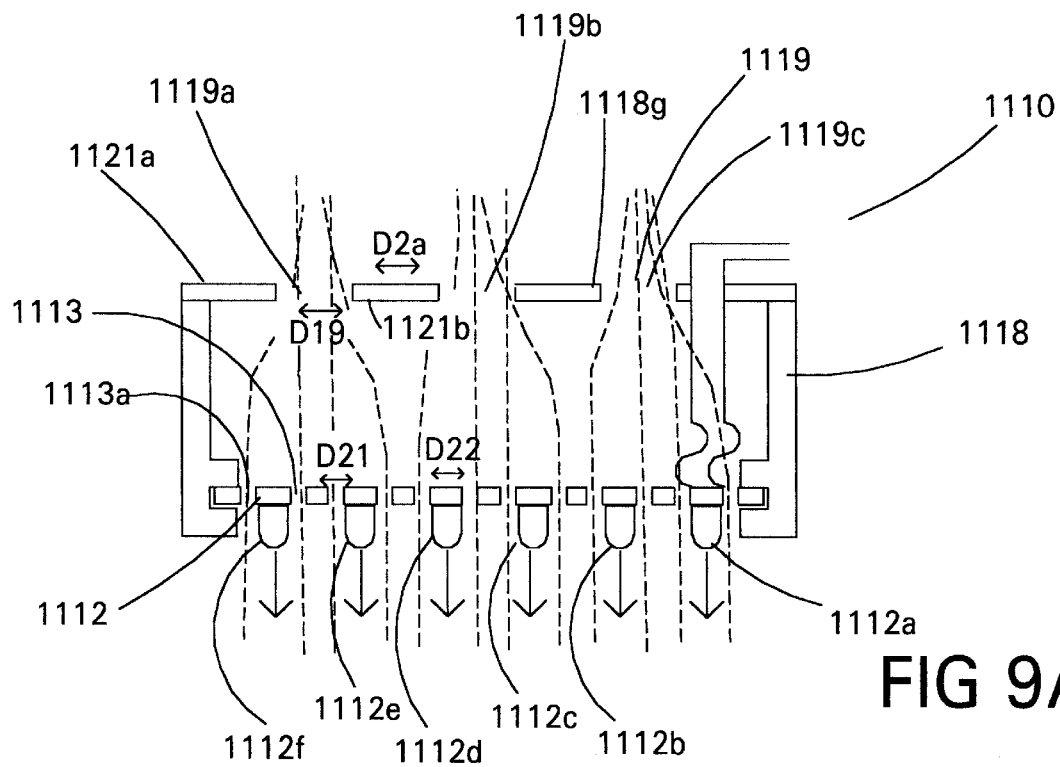
FIG. 9A Illustrates an apparatus similar to the apparatus of FIG. 4A however, further including ventilating holes.

FIG. 9A Illustrates an apparatus 1110 similar to the apparatus 510 of FIG. 4A however, with a provision for strategically placed ventilating holes. The apparatus 1110 includes a substrate 1112 and a housing 1118. The substrate 1112 includes LEDs 1112a–f. A base 1118g of the housing 1118 is shown. However, the base 1118g includes ventilation holes 1119a–c. The ventilation holes 1119a–c are placed in a uniform manner. The base 1118g in some embodiments (such as the embodiment of FIG. 9A) may be eliminated entirely. Convection of air through the substrate 1112 would happen even if no housing base 1118g existed for the FIG. 9A embodiment. However, for the FIG. 9B embodiment the housing base 1218g is more important as the fan 1217 provides a vacuum in the housing 1218 pulling air through the ventilation holes in the substrate 1212. The width, D19, of the ventilation holes 1119a–c of FIG. 9A (if a housing has multiple holes as shown as it may not be necessary and one large hole or other means of allowing the air to escape may be all that is required) should be large enough to allow the air movement created by the convection to escape freely.

The ventilation holes in the substrate 1112 or 1212 are preferred to be in close proximity to each of the LEDs (such as LED 1112f or LED 1212f). The moving air traveling through the ventilation holes (1113a or 1213a) in the substrate (1112 or 1212) carries heat away from the LED that is generated by the LED. The size of the hole would be optimized to carry a certain volume of air at a certain velocity. The size of the hole might be different for a forced air cooling system from that of a convection system. The size of the hole would also depend on the amount of cooling required.

Despite the holes 1119, the base 1118g may still be a unified piece. I.e. despite the holes 1119a, 1119b, and 1119c, the piece 1121a is still connected to piece 1121b, etc. etc. Similarly despite the holes 1113, the substrate 1112 is still a unified piece.

Figure 9B:
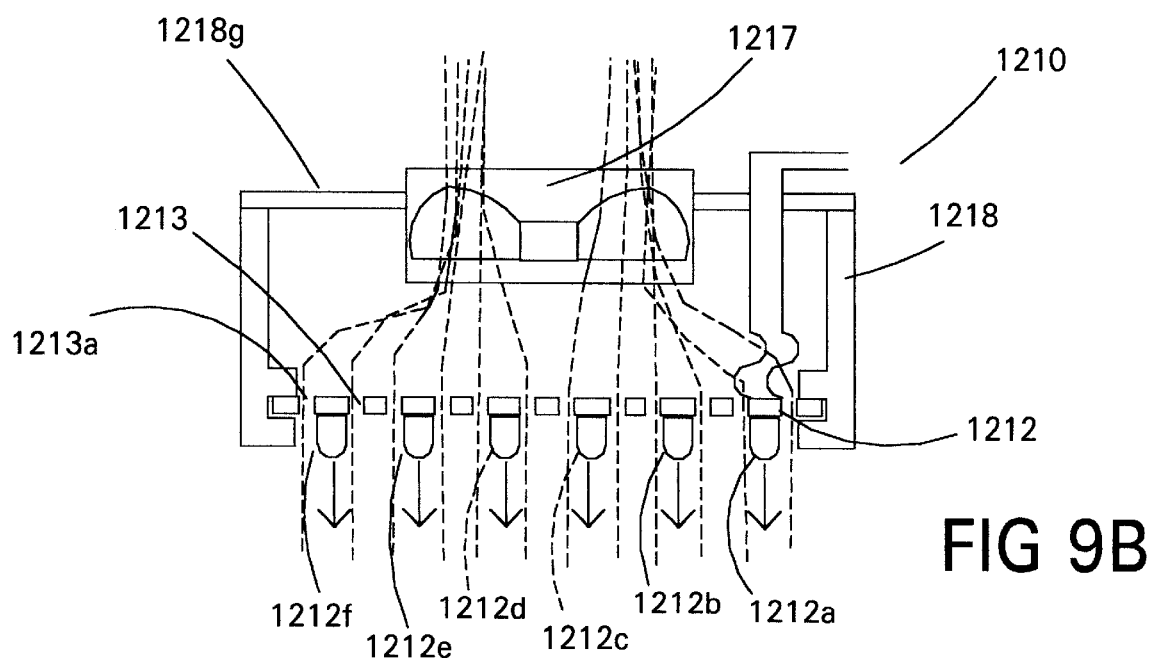
FIG. 9B Illustrates an apparatus similar to the apparatus of FIG. 4A however, further including ventilating holes and a fan.

FIG. 9B illustrates an apparatus 1210 which includes a substrate 1212, a housing 1218, and a fan 1217. The substrate includes LEDs 1212a–1212f similar to those previously described in FIG. 9A. The housing 1218 includes a base 1218g into which the fan 1217 is mounted, possibly by cutting a hole in base 1218g and inserting the fan 1217 into the base 1218g and attaching the fan 1217 to the base 1218g.

The substrate 1212 has holes for ventilation 1213, including hole 1213a which are of the same type as holes 1113 shown in FIG. 9A. The fan 1217 is used to provide a forced air cooling system using a fan 1217 which is mounted within the a base 1218g of the housing 1218. The airflow direction could be either direction.

Figure 10A:
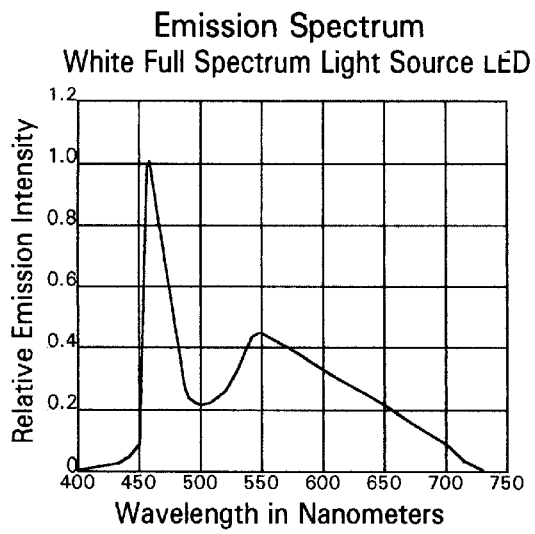
FIG. 10A shows a graph of the emission spectrum of a white LED.

FIG. 10A shows a graph 1310 of the emission spectrum of a white continuous spectrum LED such as one of the white LEDs of set 1012b of FIG. 8. The x axis plots the wavelength in nanometers while the y axis shows the relative emission intensity i.e. spectral output is compared in relation to the peak intensity. The units for the relative emission intensity are a percentage of intensity.

Figure 10B:
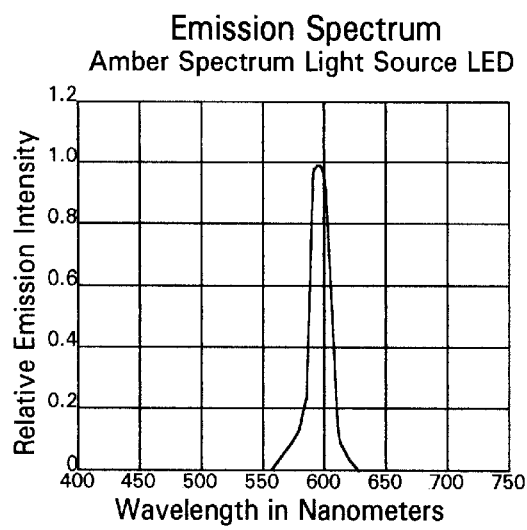
FIG. 10B shows a graph of the emission spectrum of an amber LED.

FIG. 10B shows a graph 1410 of the emission spectrum of an amber LED such as one of the amber spectrum LEDs of set 1012a of FIG. 8. Again, the x axis shows the wavelength in nanometers and the y axis shows the relative emission intensity.

Figure 10C:
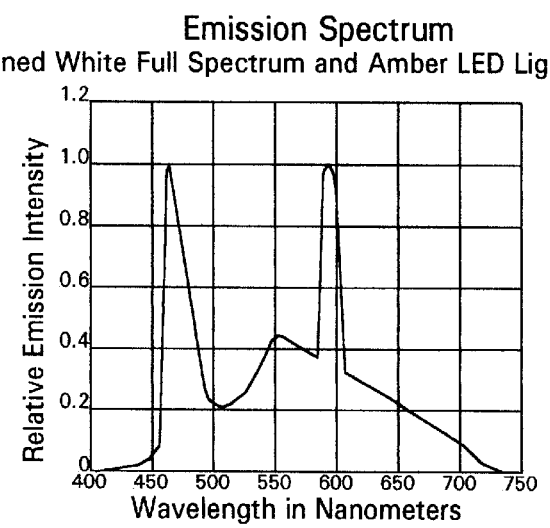
FIG. 10C shows a graph of the emission spectrum for the combination of LEDs of FIG. 10A and 10B.

FIG. 10C shows a graph 1510 of the additive emission spectrum when combining the energy from the white and amber LEDs of FIG. 10A and 10B. This spectrum will vary depending on the intensity and quantity or ratio of the white and amber LEDs. A green, yellow, blue or red LED may be used in combination with the white LEDs to alter perceived color temperature at different wavelengths. The Y axis again shows wavelength in nanometers and the x-axis shows relative emission intensity.

Figure 11A:
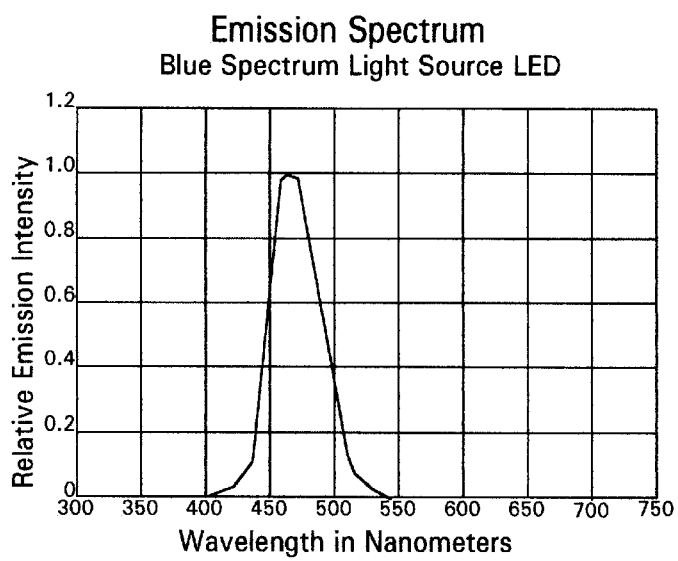
FIG. 11A shows a graph of the emission spectrum of a blue LED.

FIG. 11A shows a graph 1610 of the emission spectrum of a visible blue spectrum LED such as a blue LED used in FIG. 3D. Again, wavelength in nanometers is on the x axis and relative emission intensity is on the y axis.

Figure 11B:
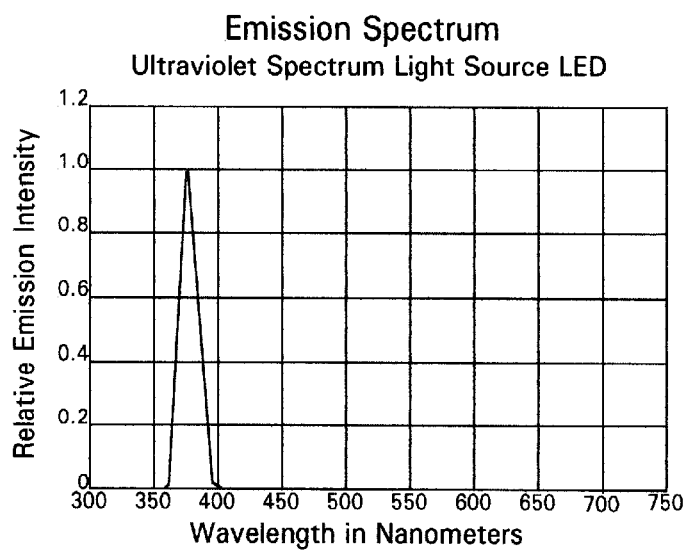
FIG. 11B shows a graph of the emission spectrum of an ultraviolet LED light source.

FIG. 11B graphs an emission spectrum of an ultraviolet LED, again x axis shows wavelength in nanometers, y axis shows relative emission intensity.

Figure 11C:
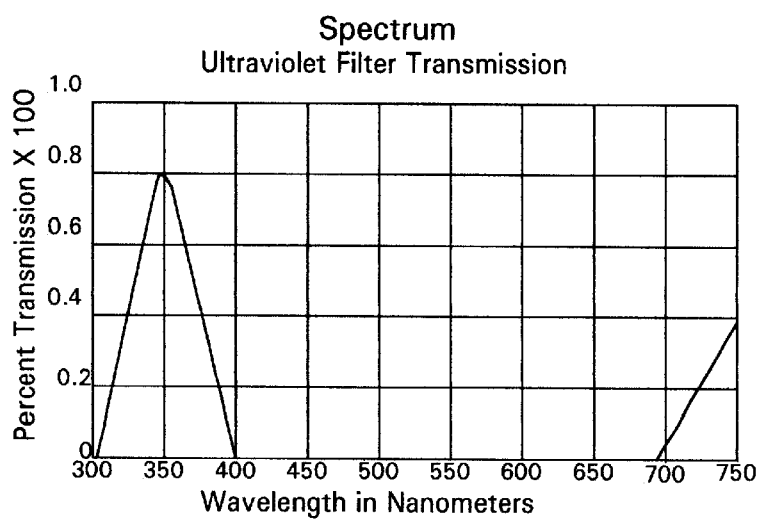
FIG. 11C shows a graph of the emission spectrum for an ultraviolet transmission filter.

FIG. 11C graphs a black light filter like that is commonly used with wider spectrum light sources to filter out all light except the desired ultraviolet. In this case the x axis shows wavelength in nanometers and y axis shows "percent transmission×100", i.e. the percentage of transmission or the wave length that the filter passes. Notice that some of the transmitted energy is in the visible spectrum at around 400 nanometers and at 700 to 750 nanometers. This transmission of unwanted visible light most often allows the black light projector to be seen as a bluish purple color when light is being passed through the filter. Ultraviolet LEDs transmit only ultraviolet light without transmitting any visible.

FIG. 12A shows a multiparameter lighting apparatus 1910, which is a further embodiment of the present invention. The multiparameter light 1910 includes the substrate 912, housing 970, motor 950, electronic housing 960 which are the same as those shown in FIGS. 7B and 7C. However the apparatus 1910 also includes a variable filter 1913. The variable filter 1913 in the state shown by FIG. 12A causes a the concentration of light 927a from for example LED 912a to come out of the filter in the same direction as shown by arrow 1913a.

The variable filter 1913 may be a liquid crystal emulsion filter mounted after the light sources 912a–f. In FIG. 12A the filter 1913 is placed at a particular voltage state causing the light from the light sources to pass through the filter undeflected in FIG. 12A.

In FIG. 12B the light rays emitted by the light sources 912a–f are shown scattered when they come out of filter 1913. For example the light ray 927a from the LED 912a comes out the filter 1913 scattered as light rays as 1913b and 1913c. The light from the other LEDs 912b–f is similarly scattered. The liquid crystal emulsion filter which can be used for filter 1913 as manufactured by 3M corporation may also be manufactured of two sheets of glass with the emulsion spread between. The voltage is applied through a conductive film deposited on the glass surface. In FIG. 12B the filter 1913 is place at a different voltage state causing the crystals to diffuse and scatter the light passing through the filter can be varied. The circuitry for varying the voltage to the filter 1913 is well know in the electronics art.

Figure 12C:
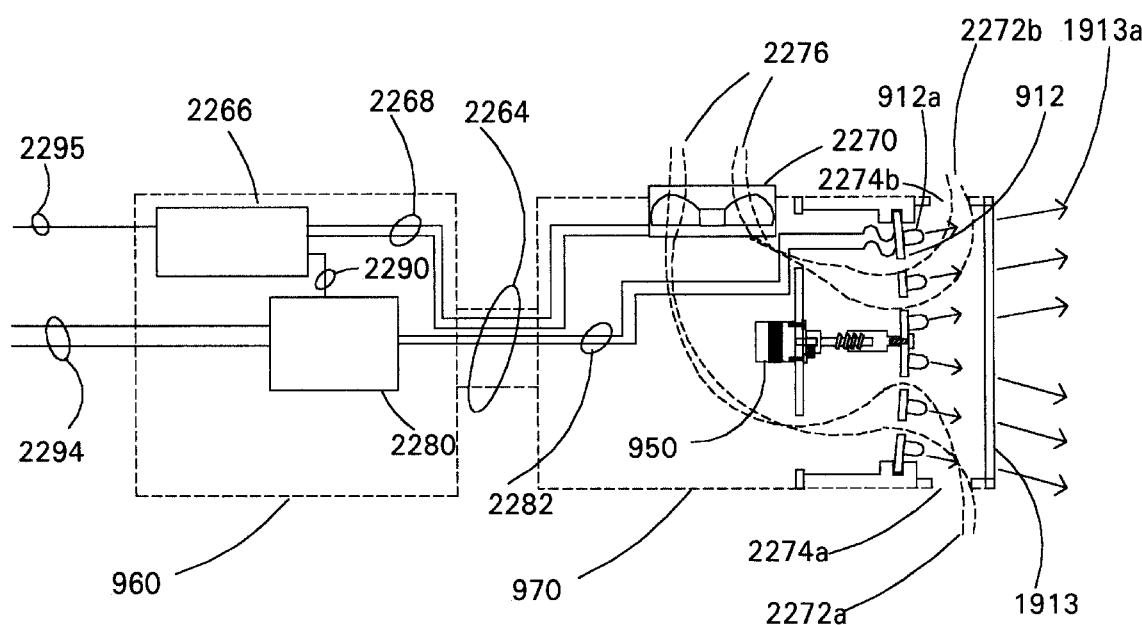
FIG. 12C shows an internal view of components for use with the embodiment of FIGS. 12A and 12B.

FIG. 12C illustrates an internal view of components for use with the embodiment of FIGS. 12A and 12B. FIG. 12C shows electronic housing 960 and lamp housing 970.

Electronic housing 960 includes processor 2266 (or control and communications board) and lamp driver circuit 2280. The lamp housing 970 includes fan 2270, motor 950, substrate 912, and variable filter 1913.

The variable filter 1913 in the state shown by FIG. 12A causes the concentration of light 927a from for example LED 912a to come out of the filter in the same direction as shown by arrow 1913a. As in FIG. 12B the light emitted by the LED 912A may be diffused by the variable filter 1913. For simplicity the connecting wires that supply the signal to vary the filter are not shown.

The electronic housing 960 that may be the base of the multiparameter light may also house the various power supplies and control circuits. In FIG. 12C the electronic housing 960 is connected to the lamp housing 970 by means of a bearing assembly 2264. The bearing assembly 2264 is shown simplified. The control circuit supply wires 2282 for the plurality of light sources, such as 912a, is sent from the lamp driver circuit 2280 through the bearing assembly 2264. The fan 2270 is connected via power supply wires 2268 to a fan control circuit located on the control and communications board 2266. Not all the wiring that passes through the bearing assembly 2264 is shown for the sake of simplicity. One bearing assembly 2264 is shown for simplicity however multiple bearing assemblies are commonly used to allow the lamp housing 970 to pan and tilt in relation to the electronic housing 960. Motors (not shown) are used as in the prior art to remotely control the position of the lamp housing 970 in relation to the electronic housing 960.

A control signal is applied to the communications board 2266 via communications line 2295. The communications board 2266 may provide a signal to the control circuit 2280 via communications line 2290 that provides information as to how the plurality of light sources such as 912a may be controlled as well as supply control information to the filter 1913 via control wires (not shown). The control circuit 2280 may receive power from a power source via wires 2294. The power source may be any suitable means of supplying electricity.

Within the lamp housing 970, a motor 950 is shown that provides the mechanical means to deform the substrate 912 that houses the LEDs 912a. The motor control wires are not shown for simplicity. The substrate 912 is constructed with strategically placed ventilation holes such as those shown in FIG. 9A and 9B. Cooling air 2276, 2272a, and 2272b is moved through the fan 970, the ventilation holes in substrate 912, and the ventilation ports 2274a and 2274b. The airflow may be exhausted by the fan or the fan may pressurize the lamp housing to exhaust the air through ports 2274a and 2274b.

In FIG. 12C the plurality of light sources i.e. LEDs 912a, may be controlled directly by the control circuit 2280 as shown. A control circuit may also be fixed on to the flexible substrate 912 and a communications node also fixed to the substrate 912, may receive control communications directed by the communications processor board 2266 or communications from the control circuit 2280. Each of the LEDs 912a may be individually controlled by the control circuit 2280. The control circuit 2280 may control a plurality of parameters of each LED such as the intensity and on-off parameters of each LED of LEDs 912a.

I claim:

1. An apparatus comprising:
a flexible substrate to which a plurality of light sources are fixed;
a flexible substrate housing in which the flexible substrate is located;
wherein the flexible substrate is comprised of a peripheral region and a center region;
and further comprising a flexing device for flexing the flexible substrate by applying pressure to the center region of the flexible substrate to cause the flexible substrate to deform;
and wherein in a first state when the flexible substrate is not deformed by the flexing device, each of the plurality of light sources emits light which is concentrated in a first direction;
and wherein in a second state when the flexible substrate has been deformed by the flexing device, at least one of the plurality of light sources emits light which is concentrated in a second direction which differs from the first direction; and
wherein the flexible substrate housing is comprised of a removable holder and a case;
wherein the flexing device is comprised of the removable holder and the case;
and wherein the removable holder can be connected onto the case; and
and wherein the connecting of the removable holder onto the case can cause the flexible substrate to deform.

2. The apparatus of claim 1 and wherein
the removable holder can be connected to the case by variably tightening the removable holder to the case to thereby apply a variable amount of pressure to the flexible substrate and a corresponding variable amount of deformation of the flexible substrate.

3. The apparatus of claim 2 wherein
the removable holder when tightened causes the center region of the flexible substrate to be forced upwards by a surface of a battery.

4. The apparatus of claim 3 wherein
the removable holder when screwed tightly causes the center region of the flexible substrate to be forced upwards by a terminal of a battery.

5. The apparatus of claim 1 and wherein
the removable holder is in the form of a cover and the case is in the form of a flashlight case.

6. An apparatus comprising:
a flexible substrate to which a plurality of light sources are fixed;
a flexible substrate housing in which the flexible substrate is located;
wherein the flexible substrate is comprised of a peripheral region and a center region;
and further comprising a flexing device for flexing the substrate by applying pressure to the center region of the flexible substrate to cause the flexible substrate to deform;
wherein in a first state when the flexible substrate is not deformed by the flexing device each of the plurality of light sources emits light which is concentrated in a first direction;
wherein in a second state when the flexible substrate has been deformed by the flexing device at least one of the plurality of light sources emits light which is concentrated in a second direction which differs from the first direction;

and wherein the flexible substrate is comprised of a center electrical terminal located at the center region of the flexible substrate and wherein the flexing device makes electrical contact with the center electrical terminal of the flexible substrate when the flexing device applies pressure to the center region of the flexible substrate.

7. The apparatus of claim 6 wherein each light source on the flexible substrate has a first terminal and a second terminal, and each first and second terminal is electrically connected to its own first and second conductive material on the flexible substrate, respectively;

wherein the first conductive materials for all the light sources are electrically connected to a center conductive material on the flexible substrate;

wherein the second conductive materials for all the light sources are electrically connected to a peripheral conductive material on the flexible substrate;

and wherein by applying a positive terminal of a signal source to the center conductive material and by applying a negative terminal of the signal source to the peripheral conductive material, the plurality of light sources can be turned on.

8. The apparatus of claim 6 wherein each light source on the flexible substrate has a first terminal and a second terminal, and each first and second terminal is electrically connected to its own first and second conductive material on the flexible substrate, respectively;

wherein the first conductive materials for all the light sources are electrically connected to a center conductive material on the flexible substrate;

wherein the second conductive materials for all the light sources are electrically connected to its own separate distinct peripheral conductive material on the flexible substrate;

and wherein by applying a positive terminal of a signal source to the center conductive material and by applying a negative terminal of the signal source to the appropriate peripheral conductive material, a particular light source can be turned on.

9. The apparatus of claim 6 wherein the plurality of light sources are light emitting diodes.

10. An apparatus comprising:

a flexible substrate to which a plurality of light sources are fixed;

a flexible substrate housing in which the flexible substrate is located;

wherein the flexible substrate is comprised of a peripheral region and a center region;

and further comprising a flexing device for flexing the substrate by applying pressure to the center region of the flexible substrate to cause the flexible substrate to deform;

wherein the flexible substrate housing applies pressure to the peripheral region of the flexible substrate in a substantially opposite direction to the pressure being applied to the center region and while pressure is being applied to the center region of the flexible substrate;

and wherein in a first state when the flexible substrate is not deformed by the flexing device each of the plurality of light sources emits light which is concentrated in a first direction;

and wherein in a second state when the flexible substrate has been bent by the flexing device at least one of the plurality of light sources emits light which is concentrated in a second direction which differs from the first direction; and wherein the flexing device is comprised of a battery having a first terminal, wherein the first terminal of the battery applies pressure to the center region of the flexible substrate to cause the flexible substrate to deform.

11. An apparatus comprising:

a flexible substrate to which a plurality of light sources are fixed;

a flexible substrate housing in which the flexible substrate is located;

wherein the flexible substrate is comprised of a peripheral region and a center region;

and further comprising a flexing device for flexing the substrate by applying pressure to the center region of the flexible substrate to cause the flexible substrate to deform;

and wherein in a first state when the flexible substrate is not deformed by the flexing device, each of the plurality of light sources emits light which is concentrated in a first direction;

and wherein in a second state when the flexible substrate has been bent by the flexing device at least one of the plurality of light sources emits light which is concentrated in a second direction which differs from the first direction;

wherein each light source on the flexible substrate has a first terminal and a second terminal, each first and second terminal is electrically connected to its own first and second conductive material on the flexible substrate, respectively;

wherein the first conductive materials for all the light sources are electrically connected to a center conductive material on the flexible substrate;

wherein the second conductive materials for all the light sources are electrically connected to a peripheral conductive material on the flexible substrate;

and wherein by applying a positive terminal of a signal source to the center conductive material and by applying a negative terminal of the signal source to the peripheral conductive material, the plurality of light sources can be turned on.

12. An apparatus comprising:

a flexible substrate to which a plurality of light sources are fixed;

a flexible substrate housing in which the flexible substrate is located;

wherein the flexible substrate is comprised of a first region and a second region;

and further comprising a flexing device for flexing the substrate by applying pressure in a first direction to the second region of the flexible substrate and simultaneously applying pressure in a second direction to the first region of the flexible substrate, wherein the first direction is substantially opposite the second direction, to cause the flexible substrate to deform;

and wherein in a first state when the flexible substrate is not deformed by the flexing device each of the plurality of light sources emits light which is concentrated in a third direction;

and wherein in a second state when the flexible substrate has been deformed by the flexing device at least one of the plurality of light sources emits light which is concentrated in a fourth direction which differs from the third direction; and wherein the flexible substrate housing is comprised of a removable holder and a case;

wherein the flexing device is comprised of the removable holder and the case;

and wherein the removable holder can be connected to the case; and and wherein the connecting of the removable holder onto the case can cause the flexible substrate to deform.

* * * * *